(12) United States Patent
Ohsawa

(10) Patent No.: US 7,804,731 B2
(45) Date of Patent: Sep. 28, 2010

(54) SEMICONDUCTOR MEMORY DEVICE AND DRIVING METHOD THEREFOR

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 12/132,152

(22) Filed: Jun. 3, 2008

(65) Prior Publication Data

US 2008/0316848 A1 Dec. 25, 2008

(30) Foreign Application Priority Data

Jun. 20, 2007 (JP) ............................. 2007-162529

(51) Int. Cl.
*G11C 7/00* (2006.01)
(52) U.S. Cl. .................. 365/222; 365/185.01
(58) Field of Classification Search .................. 365/222, 365/185.01
See application file for complete search history.

(56) References Cited

U.S. PATENT DOCUMENTS

| 7,251,179 | B2 | 7/2007 | Ohsawa |
| 2008/0165605 | A1 * | 7/2008 | Fisch et al. .................. 365/222 |

FOREIGN PATENT DOCUMENTS

| JP | 02-123592 | 5/1990 |
| JP | 2002-133861 | 5/2002 |
| JP | 2005-302077 | 10/2005 |
| JP | 2006-73062 | 3/2006 |
| JP | 2006-146992 | 6/2006 |

OTHER PUBLICATIONS

JPO Notification of Reasons for Rejection for JP 2007-162529, issued on May 28, 2010 with English translation.

* cited by examiner

*Primary Examiner*—Hoai V Ho
*Assistant Examiner*—Jason Lappas
(74) *Attorney, Agent, or Firm*—Oblon, Spivak, McClelland, Maier & Neustadt, L.L.P.

(57) ABSTRACT

This disclosure concerns a semiconductor memory device comprising memory cells including floating bodies and storing therein logic data; bit lines and word lines connected to the memory cells; sense amplifiers connected to the bit lines; a refresh controller instructing a refresh operation for restoring deteriorated storage states of the memory cells; and a refresh interval timer setting a refresh interval between one refresh operation and a next refresh operation to a first interval in a data read mode or a data write mode, and setting the refresh interval to a second interval longer than the first interval in a data retention mode, the data read mode being a mode in which the data stored in the selected memory cell is read to an outside of the device, the data write mode being a mode in which data from the outside is written to the selected memory cell.

11 Claims, 14 Drawing Sheets

REFRESH OPERATION DURING A DATA RETENTION OPERATION

FIRST EMBODIMENT tRPc TIMER Tmr3

FIRST REFRESH INTERVAL TIMER(WRITE OR READ)Tmr1

SECOND REFRESH INTERVAL TIMER (DATA RETENTION) Tmr2

REFRESH OPERATION DURING A READ OR WRITE OPERATION

REFRESH OPERATION DURING A DATA RETENTION OPERATION

SECOND EMBODIMENT

THIRD EMBODIMENT

SEMICONDUCTOR MEMORY DEVICE AND DRIVING METHOD THEREFOR

CROSS-REFERENCE TO RELATED APPLICATION

This application is based upon and claims the benefit of priority from the prior Japanese Patent Applications No. 2007-162529, filed on Jun. 20, 2007, the entire contents of which are incorporated herein by reference.

BACKGROUND OF THE INVENTION

1. Field of the Invention

The present invention relates to a semiconductor memory device and a driving method therefore, and relates to, for example, an FBC (Floating Body Cell) memory device storing therein information by accumulating carriers in floating bodies of respective field effect transistors.

2. Related Art

In recent years, there has been known an FBC memory device as a semiconductor memory device expected to replace a 1T (Transistor)-1C (Capacitor) DRAM. The FBC memory device is configured so that FETs (Field Effect Transistors) each including a floating body (hereinafter, also "body") are formed on an SOI (Silicon On Insulator) substrate. The FBC memory device stores data "1" or "0" in each FET according to the number of majority carriers accumulated in the body of the FET.

In an FBC constituted by, for example, an nFET, it is defined that a state in which the number of holes accumulated in the body is large is data "1" and that a state in which the number of holes accumulated in the body is small is data "0". Further, a memory cell storing therein data "0" is referred to as ""0" cell", and a memory cell storing therein data "1" is referred to as ""1" cell".

To retain data in each memory cell for a long time, it is necessary to set a potential of the body made of a p-type semiconductor lower than that of a source and a drain made of an n-type semiconductor. To retain data in the memory cell, a potential of a word line connected to the memory cell is set negative with respect to a potential 0 V of the source. Accordingly, a state of data "0" is deteriorated by causing holes to flow into the body of the "0" cell while the data is being held. To recover the state of the data "0" from the deterioration, it is necessary to execute refresh operation on all memory cells at certain time's intervals. The refresh operation is an operation for selecting all word lines in order and for restoring deteriorated storage states of all the memory cells to original states.

Even while an unselected "0" cell is in a data retention state, GIDL (Gate Inducted Drain Leakage) occurs to the unselected "0" cell if data "1" is written to a selected memory cell connected to a bit line connected to the unselected "0" cell. The GIDL is a phenomenon where holes flow into the body of the unselected "0" cell by band-to-band tunneling of the unselected "0" cell if a potential of a word line connected to the unselected "0" cell is negative and that of the bit line connected thereto is positive while the unselected "0" cell is in the data retention state. If a data retention period is long after data "0" is written to the unselected memory cell, i.e., the "0" cell, the number of holes flowing into the body of the unselected "0" cell is increased by writing of data "1" to the other memory cells connected to the bit line connected to the unselected "0" cell. As a result, the data "0" is deteriorated. This phenomenon is called "bit line "1" disturbance".

When data "0" is written to a memory cell, the potential of the bit line connected to the memory cell, i.e., "0" cell is made negative. Due to this, a drain potential of a "1" cell connected to the same bit line is often made slightly lower than a body potential of the "1" cell. A weak forward bias is applied between the body and the drain of this "1" cell. This forward bias disturbs the "1" cell connected to the same BL as the cell to which data "0" is to be written. This phenomenon is called "bit line "0" disturbance".

To deal with the bit line disturbance, it is necessary to perform the refresh operation on all the memory cells more frequently than a simple cycle required for retaining data.

The degree of the influence of the bit line disturbance varies according to the execution frequency of read or write operation. For example, if the read or write operation is executed more frequently from a certain refresh operation until a next refresh operation in a read or write mode, an unselected memory cell is greatly influenced by the bit line disturbance. Normally, an execution interval of the refresh operation is set according to memory cells greatly influenced by the bit line disturbance. Due to this, in the data retention period in which no read or write operation is performed, the execution frequency of the refresh operation is excess. As a result, power consumption is excessively high in the data retention period.

SUMMARY OF THE INVENTION

A semiconductor memory device according to an embodiment of the present invention comprises a plurality of memory cells including floating bodies in electrically floating state and storing therein logic data according to number of carriers accumulated in the floating bodies; a plurality of bit lines connected to the memory cells; a plurality of word lines connected to the memory cells; a plurality of sense amplifiers connected to the bit lines, and one of the sense amplifiers reading data stored in one of the memory cells selected by one of the bit lines and one of the word lines or writing data to the one of the memory cells selected by the one of the bit lines and the one of the word lines; a refresh controller instructing a refresh operation for restoring deteriorated storage states of the memory cells; and a refresh interval timer setting a refresh interval between one refresh operation and a next refresh operation to a first interval in a data read mode or a data write mode, and setting the refresh interval to a second interval longer than the first interval in a data retention mode, the data read mode being a mode in which the data stored in the selected memory cell is read to an outside of the device, the data write mode being a mode in which data from the outside is written to the selected memory cell.

A method of driving a semiconductor memory device according to an embodiment of the present invention, the semiconductor memory device including: a plurality of memory cells including floating bodies in electrically floating state and storing therein logic data according to number of carriers accumulated in the floating bodies; a plurality of bit lines connected to a plurality of the memory cells; a plurality of word lines connected to a plurality of the memory cells; a plurality of sense amplifiers connected to the bit lines, and one of the sense amplifiers reading data stored in one of the memory cells selected by one of the bit lines and one of the word lines or writing data to one of the memory cells selected by one of the bit lines and one of the word lines; and a refresh controller instructing a refresh operation for restoring deteriorated storage states of the memory cells, wherein the method comprises:

executing the refresh operation in a data read mode of reading the data stored in the selected memory cell to an outside or a data write mode of writing data from the outside to the selected memory cell while setting a refresh interval between one refresh operation and a next refresh operation to a first interval; and executing the refresh operation in a data retention mode while setting the refresh interval to a second interval longer than the first interval.

DETAILED DESCRIPTION OF THE INVENTION

Embodiments of the present invention will be explained below in detail with reference to the accompanying drawings. Note that the invention is not limited thereto.

First Embodiment

Figure 1:
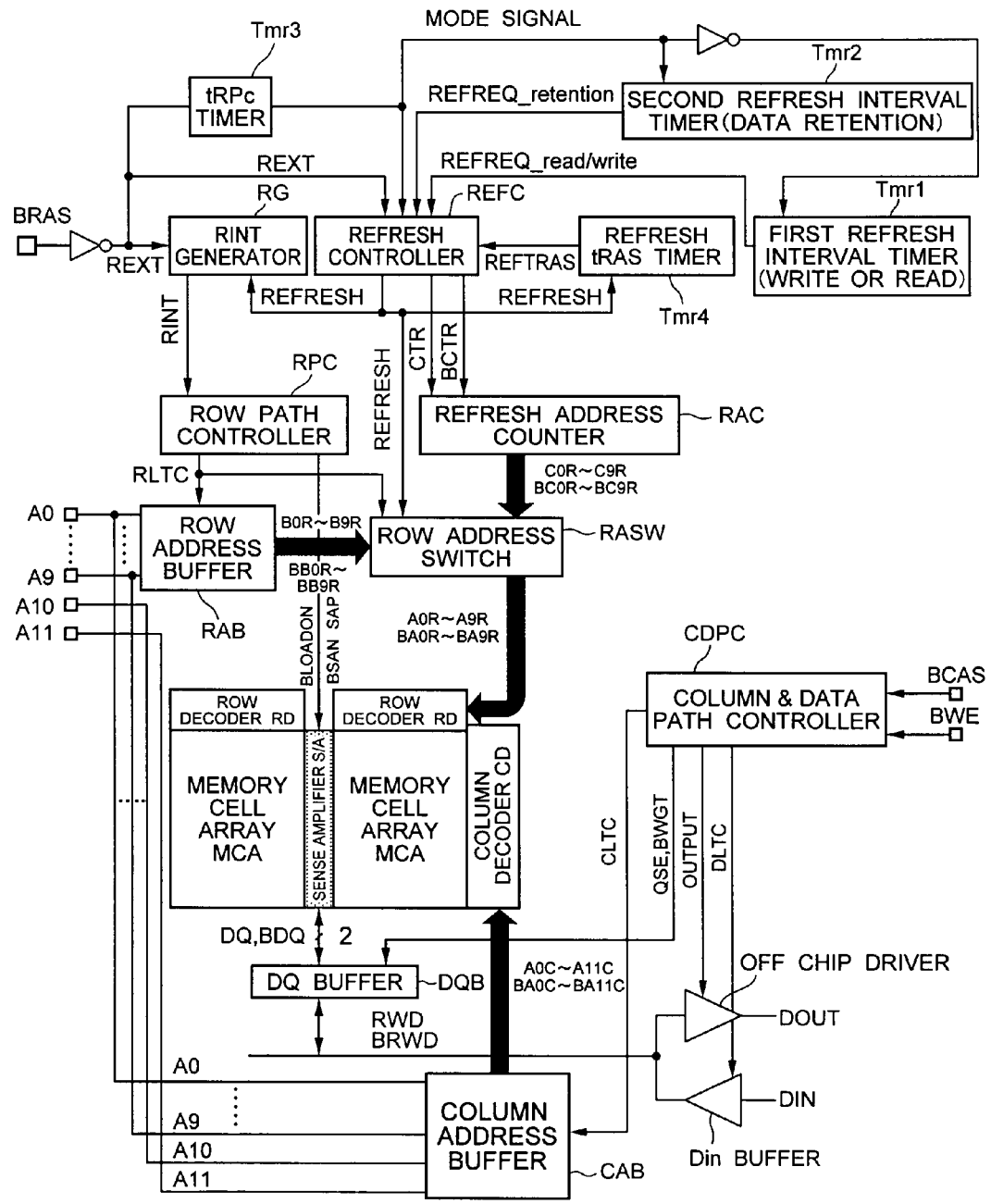
FIG. 1 is a block diagram showing a configuration of an FBC memory device according to a first embodiment of the present invention.

FIG. 1 is a block diagram showing a configuration of an FBC memory device according to a first embodiment of the present invention. A memory cell array MCA is configured to include a plurality of memory cells MCs arranged two-dimensionally in a matrix. A gate of each memory cell MC arranged in a row direction is connected to one word line WL. A drain or a source of each memory cell MC arranged in a column direction is connected to one bit line BL.

Each of row decoders RDs decodes a row address so as to select one specific word line WL from among a plurality of word lines WLs. A column decoder CD decodes a column address so as to select one specific column from among a plurality of columns.

A row address buffer RAB receives a row address from an outside of the FBC memory device, temporarily stores therein the received row address, and outputs the row address to the row decoders RDs via a row address switch RASW. A column address buffer CAB receives a column address from the outside of the FBC memory device, temporarily stores therein the received column address, and outputs the column address to the column decoder CD. A DQ buffer DQB temporarily stores therein data read from sense amplifiers S/As so as to output the read data to the outside as input/output data I/O, or temporarily stores therein data written from the outside so as to transmit the write data to the sense amplifiers S/As.

A refresh address counter RAC is configured to select word lines in order during a refresh operation. A row address switch RASW transmits the row address from the row address buffer RAB to the row decoders RDs if a refresh signal REFRESH is inactive, and transmits the addresses from the refresh address counter RAC to the row decoders RDs if the refresh signal REFRESH is active. Namely, the row address switch RASW acts as a switch changing over the row address buffer RAB and the refresh address counter RAC according to the refresh signal REFRESH.

In this case, "active (or activation)" means turning on or driving an element or a circuit, and "inactive or deactivation" means turning off or stopping an element or a circuit. It should be noted, therefore, that a HIGH (high potential level) signal is an activation signal on one occasion and a LOW (low potential level) signal is an activation signal on another occasion. For example, an NMOS transistor is activated by making a potential level of a gate of the NMOS transistor HIGH. Meanwhile, a PMOS transistor is activated by making a potential level of a gate of the PMOS transistor LOW. The refresh operation means an operation for reading data from one memory cell MC once, latching the data to one of the sense amplifiers S/As, and writing back data identical in logic to the same memory cell MC. More specifically, the refresh operation is an operation for selecting all the word lines in the memory cell array MCA in order, and refreshing all the memory cells connected to each of the selected word lines, thereby refreshing all the memory cells in the memory cell array MCA. The refresh operation does not include per se an operation for reading data to the outside of the FBC memory device or writing data from the outside thereof. Namely, the refresh operation is an operation performed in the FBC memory device.

A RINT generator RG is a delay circuit raising a level of a signal RINT with a delay of a predetermined time only if a signal REXT indicating a read or write operation or the refresh signal REFRESH is activated to logically high level. If the signal REXT or the refresh signal REFRESH is deactivated to logically low level, the RINT generator RG promptly lowers the level of the signal RINT without delay.

For example, if an interrupt of the read or write operation is issued during one refresh operation, the signal REXT rises and the refresh signal REFRESH falls almost simultaneously with the rising of the signal REXT. Although the RINT generator RG lowers the level of the signal RINT right after the refresh signal REFRESH rises, the RINT generator RG raises the signal RINT after delay time since the signal REXT rises. The reason for setting the certain delay time since deactivation of the signal RINT to activation thereof is as follows. If an interrupt of the read or write operation is issued during the refresh operation, the refresh operation is interrupted once and the read or write operation starts. At this time, the row decoders RDs need to raise the level of word line WL selected in a read or write operation after correctly lowering those of the word lines selected in the refresh operation to logically low. It takes certain degree of time for the word lines WLs to sufficiently fall. Accordingly, the certain delay time is set since deactivation of the signal RINT until activation thereof so as to prevent malfunction. Even if the refresh operation restarts after the end of the read or write operation that has interrupt the refresh operation, the RINT generator RG sets the certain delay time since deactivation of the signal RINT until activation thereof.

A first refresh interval timer Tmr1 is a timer setting an interval between refresh operations in a data read or write mode. The refresh operation is executed regularly in a predetermined cycle. The interval between the refresh operations (hereinafter, "refresh interval") is an interval since start of one refresh operation until start of a next refresh operation. The first refresh interval timer Tmr1 receives an inverted signal with respect to a mode signal from a tRPc timer Tmr3, and outputs a signal REFREQ_read/write to a refresh controller REFC based on the inverted signal. The refresh interval in the read or write mode is set to a first interval.

A second refresh interval timer Tmr2 is a timer setting a refresh interval in a data retention mode. The second refresh interval timer Tmr2 receives the mode signal from the tRPc timer Tmr3, and outputs a signal REFREQ_retention to the refresh controller REFC based on the mode signal. The refresh interval in the data retention mode is set to a second interval.

Note that the read or write mode is a mode in which the mode signal is logically low (inactive), which mode corresponds to a state in which the FBC memory device is frequently accessed for reading operations of data stored in the memory cells MCs to the outside of the FBC memory device or for writing operations of data to the memory cells MCs from the outside. The read or write mode includes a state in which the read or write operation is actually executed and a precharge state. The refresh operation during the read or write mode is performed in a period of this precharge state.

Note that the memory cells MCs connected to the selected word line WL during execution of the read or write operation are refreshed (or subjected to data update). However, the refresh operation described herein does not mean an irregular refresh operation during execution of the read or write operation but a regular refresh operation.

The data retention mode is a mode in which the mode signal is logically high (active), which mode corresponds to a state in which the read or write operation does not access the FBC memory device for a long time.

The tRPc timer Tmr3 is an operation detection timer outputting the mode signal to the first refresh interval timer Tmr1 and the second refresh interval timer Tmr2. The tRPc timer Tmr3 detects whether the FBC memory device is in the read or write mode or the data retention mode based on the signal REXT (BRAS) and changes the mode signal. For example, if the signal REXT is logically high (BRAS is active), the tRPc timer Tmr3 changes the mode signal to be logically low so as to indicate that the FBC memory device is in the read or write mode. If the mode signal is logically low, then the second refresh interval timer Tmr2 deactivates the signal REFREQ_retention, and the first refresh interval timer Tmr1 activates the signal REFREQ_read/write. As a result, the refresh interval is set to the first interval.

If the signal REXT is logically low for a longer period than a certain period tRPc (If BRAS is inactive during the period tRPc or longer), the tRPc timer Tmr3 changes the mode signal to be logically high so as to indicate that the FBC memory device is in the mode retention mode. If the mode signal is logically high, then the first refresh interval timer Tmr1 deactivates the signal REFREQ_read/write, and the second refresh interval timer Tmr2 activates the signal REFREQ_retention. As a result, the refresh interval is set to the second interval.

However, as described later, if the BRAS is inactive for a shorter period than the period tRPc, the tRPc timer Tmr3 does not determine that the FBC memory device is in the data retention mode and keeps the mode signal to be logically low. Namely, if the BRAS is active, the tRPc timer Tmr3 promptly determines that the FBC memory device is in the read or write mode. On the contrary, if the BRAS is inactive, the tRPc timer Tmr3 does not promptly determine that the FBC memory device is in the data retention mode but determines that the FBC memory device is in the data retention mode as long as the BRAS is kept inactive for a longer period than the certain period tRPc.

The refresh controller REFC receives the mode signal, the signal REFREQ_read/write, and the signal REFREQ_retention, and outputs the refresh signal REFRESH based on these signals. By activation of the refresh signal REFRESH, the refresh operation is executed.

A refresh tRAS timer Tmr4 receives the signal REFRESH, and outputs a signal REFTRAS that is the delayed signal REFRESH to the refresh controller REFC. The refresh tRAS timer Tmr4 thereby decides the refresh operation time.

Figure 2:
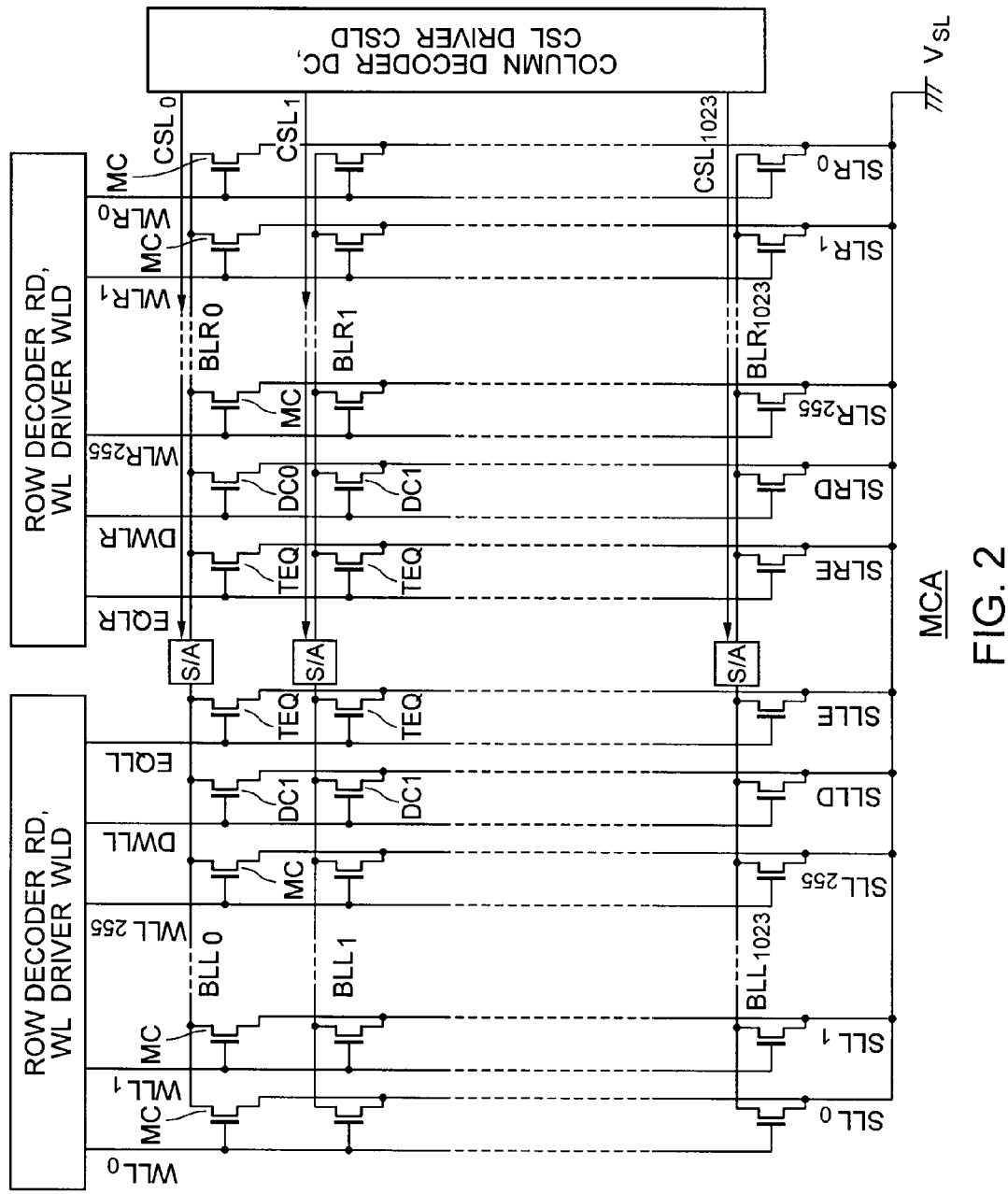
FIG. 2 is a circuit diagram showing an example of the memory cell array MCA.

FIG. 2 is a circuit diagram showing an example of the memory cell array MCA. The memory cell array MCA is configured to include the memory cells MCs arranged two-dimensionally in a matrix. Each of the word lines WLs extends in the row direction and is connected to the gate of each memory cell MC. 256 word lines (WLL0 to WLL255 or WLR0 to WLR255) are provided on the left or right of the sense amplifiers S/As. Each of the bit lines BLs extends in the column direction and is connected to the source or the drain of each memory cell MC. 1024 bit lines (BLL0 to BLL1023 or BLR0 to BLR1023) are provided on the left or right of the sense amplifiers. The word lines WLs are orthogonal to the bit lines BLs. The memory cells MCs are provided at crosspoints between the word lines WLs and the bit lines BLs, respectively. These memory cells MCs are referred to as "crosspoint cells". Appellations of the row direction and the column direction are expediency, and they can be replaced with each other.

Before a data read or write operation, data "0" and data "1" having reversed polarities with respect to each other are stored in dummy cells DC0 and dummy cells DC1, respectively. The polarity indicates a logic value "0" or "1" of data. The dummy cells DC0 and DC1 are used to generate a reference current Iref for detecting data stored in the memory cells MCs. The reference current Iref is almost intermediate between a current carried across the "0" cells and the "1" cells. A current mirror circuit (see FIG. 4) included in each sense amplifier S/A applies a current to the memory cells MCs via one bit line BL. A current according to the data stored in the memory cells MCs is carried across sense nodes in the sense amplifier S/A. The sense amplifier S/A identifies whether the logic value of data is "1" or "0" according to whether the current carried across is higher or lower than the reference current Iref.

The dummy cells DC0 and DC1 are arranged alternately in the direction (row direction) in which the word lines WLs extend. The dummy cells DC0 as many as the dummy cells DC1 are provided so as to generate the reference current Iref.

Dummy word lines DWLs extend in the row direction and are connected to gates of the dummy cells DC0 and DC1. One dummy word line DWL is provided at each of the left and right of the sense amplifiers S/As.

Equalizing lines EQLs are connected to gates of equalizing transistors TEQs. Each of the equalizing transistors TEQs is connected between one bit line BL and a ground (VSL). In equalizing operation, the equalizing transistors TEQs connect the bit lines BL to the ground, thereby equalizing potentials of the respective bit lines to a ground potential.

Source lines SLs, dummy source lines DSLs, and equalizing source lines SLEQs are connected to a source potential (ground) VSL.

A WL driver WLD applies a voltage to a selected word line WL, thereby activating the selected word line WL. A CSL driver CSLD applies a potential of a column selection line CSL on a selected column, thereby reading data from the sense amplifier S/A on the selected column via a DQ buffer.

Figure 3:
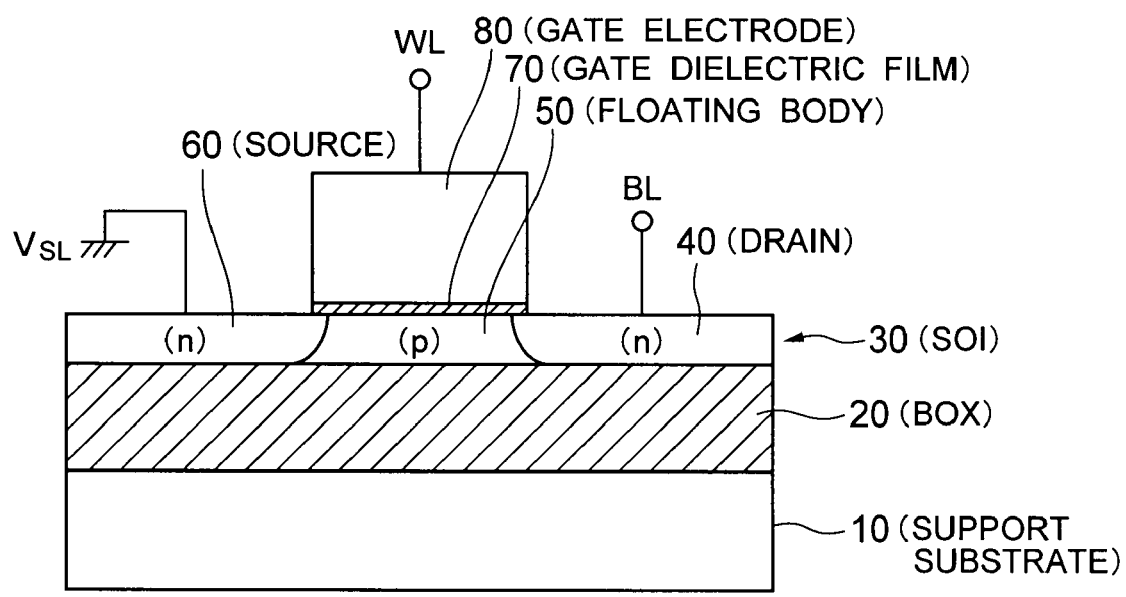
FIG. 3 is a cross-sectional view showing a structure of each memory cell MC.

FIG. 3 is a cross-sectional view showing a structure of each memory cell MC. Note that each dummy cell DC is similar in structure to the memory cell MC. The memory cell MC is provided on an SOI substrate that includes a supporting substrate 10, a BOX layer 20, and an SOI layer 30. A source 60 and a drain 40 are provided in the SOI layer 30. A floating body 50 is formed between the source 60 and the drain 40 in the SOI layer 30. The body 50 is a semiconductor opposite in conduction type to the source 60 and the drain 40. In the first embodiment, the memory cells MCs are nFETs. The body 50 is surrounded by the source 60, the drain 40, the BOX layer 20, a gate dielectric film 70, and STI (Shallow Trench Isolation) (not shown), thereby being in an electrically floating state. The FBC memory device can store logic data (binary data) in each memory cell MC according to the number of majority carriers accumulated in the body 50 of the memory cell MC.

One of methods of writing data to one memory cell MC will be described. To write data "1" to one memory cell MC, the memory cell MC is caused to operate in a saturation state. For example, a potential of the word line WL connected to the memory cell MC is biased to 1.5 V and that of the word line BL connected thereto is biased to 1.5 V. A potential of the source 60 of the memory cell MC is set to a ground GND (0 V). By so setting, impact ionization occurs near the drain 40 and many pairs of electrons and holes are generated. The electrons generated by the impact ionization flow into the drain 40 whereas the holes generated by the impact ionization are accumulated in the body 50 having low potential. A voltage of the body 50 ("body potential") turns into an equilibrium state when a balance is held between a current carried when the holes are generated by the impact ionization and a forward current at a pn junction between the body 50 and the source 60. This body potential is about 0.7 V.

To write data "0" to the memory cell MC, the potential of the bit line BL is reduced to negative voltage. For example, the potential of the bit line BL is reduced to −1.5 V. By reducing the potential of the bit line BL, a pn junction between the body 50 and the drain 40 is biased largely toward forward direction. The holes accumulated in the body 50 are emitted to the drain 40, and the data "0" is stored in the memory cell MC.

One of methods of reading data from one memory cell MC will be described. In the data read operation, the word line WL connected to the memory cell MC is activated similarly to the data write operation. However, the potential of the bit line BL connected to the memory cell MC is set lower than that during the data write operation. For example, the potential of the bit line BL is set to 1.5 V and that of the bit line BL is set to 0.2 V. The memory cell MC is caused to operate in a linear region. A memory cell MC storing therein data "0" ("0" cell) differ in threshold voltage from a memory cell MC storing therein data "1" ("1" cell) due to the difference in the number of holes accumulated in the body 50. By detecting the threshold voltage difference, it is identified whether data is "1" or "0". The reason for setting the potential of the bit line BL to low voltage during the data read operation is as follows. If the voltage of the bit line BL is set high and the memory cell MC is biased into a saturation state, data "0" to be read is possibly changed to data "0" by the impact ionization.

Figure 4:
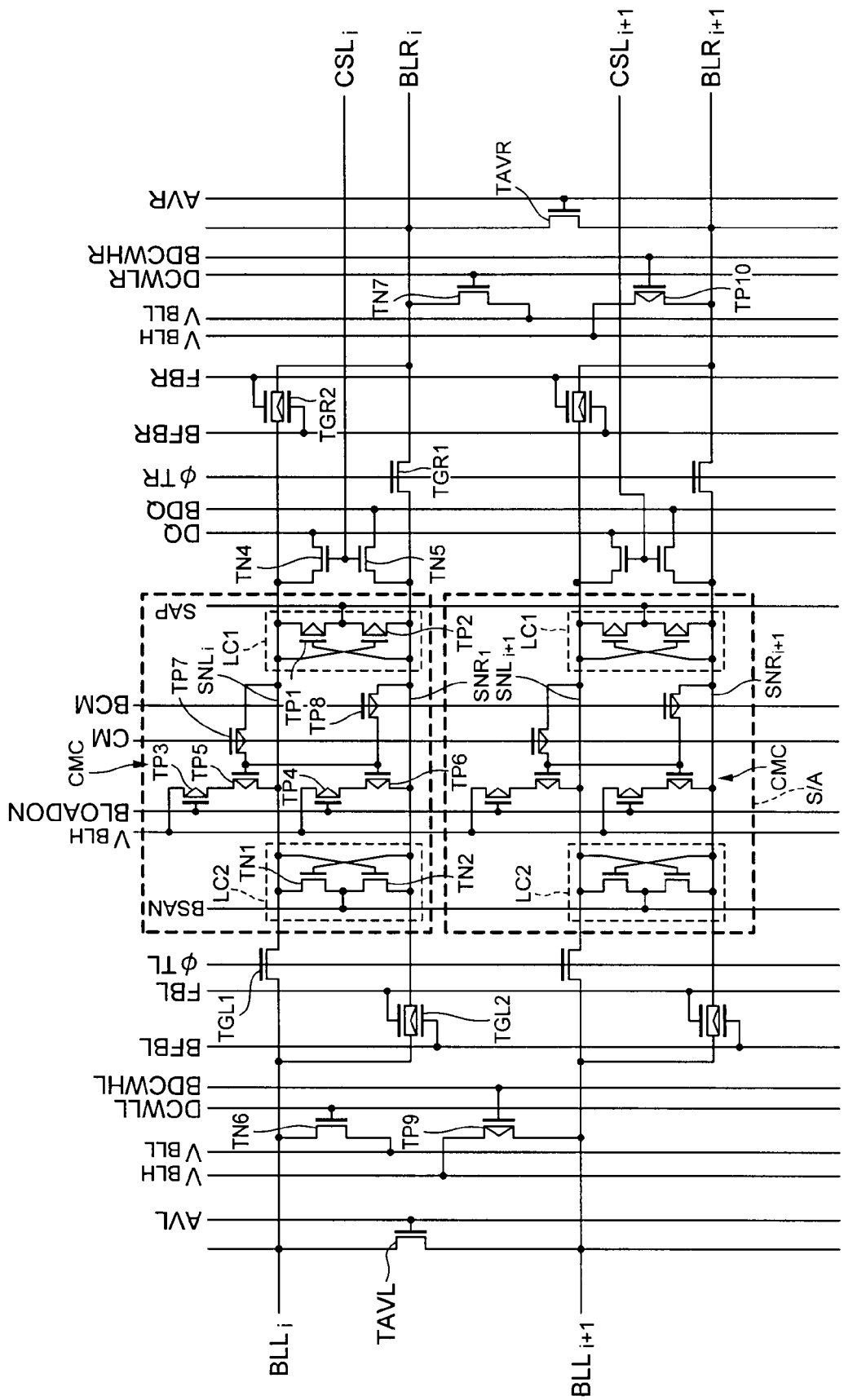
FIG. 4 is a circuit diagram showing an example of configurations of the sense amplifiers S/A.

FIG. 4 is a circuit diagram showing an example of configurations of the sense amplifiers S/A. In FIG. 4, two sense amplifiers S/As are shown. Since the both sense amplifiers S/As are identical in configuration, only the configuration of one of the sense amplifiers S/As will be described herein.

Each sense amplifier S/A is connected to one bit line BLLi and one bit line BLRi provided on the left and right of the sense amplifier S/A, respectively, and provided to correspond to a pair of bit lines ("paired bit lines") BLLi (hereinafter, also "BLL") and BLRi (hereinafter, also "BLR"). As can be seen, the FBC memory device according to the first embodiment adopts an open bit-line architecture. Due to this, during the data read operation, one of the paired bit lines BLL and BLR transmits data and the other transmits reference data.

The sense amplifier S/A includes a pair of sense nodes SNLi (hereinafter, also "SNL") and SNRi (hereinafter, also "SNR"). The sense node SNL is connected to the bit line BLL via a transfer gate TGL1 and to the bit line BLR via a transfer gate TGR2. The sense node SNR is connected to the bit line BLL via a transfer gate TGL2 and to the bit line BLR via a transfer gate TGR1.

The transfer gates TGL1 and TGR1 are controlled to be turned on or off by signals ΦTL and ΦTR, respectively. The transfer gate TGL2 is controlled to be turned on or off by signals FBL and bFBL. The transfer gate TGR2 is controlled to be turned on or off by signals FBR and bFBR. Note that signal b means an inverted signal with respect to a signal .

For example, in the data read operation, the sense amplifier S/A reads data from each memory cell MC, outputs the data to an outside of the sense amplifier S/A via a DQ buffer DQB, and writes back the data to the memory cell MC. If the sense amplifier S/A reads data from a "1" cell connected to the bit line BLL corresponding to the sense amplifier S/A, then the transfer gates TGL1 and TGR1 are turned on, and the transfer gates TGL2 and TGR2 are turned off. Since the threshold voltage of the "1" cell is relatively low, a current carried from the sense node SNL to the "1" cell is higher than the reference current Iref. Since a current carried from the sense node SNR to the bit line BLR is equal to the reference current Iref, a potential of the sense node SNL is lower than that of the sense node SNR. The sense amplifier S/A amplifies a potential difference between the sense nodes SNL and SNR, and latches the amplified potential difference. On the other hand, to writes back the data "1" to the memory cell MC, it is necessary to apply a high potential to the bit line BLL. Therefore, the transfer gate TGL1 is turned off and the transfer gate TGL2 is turned on, thereby connecting the high potential sense node SNR to the bit line BLL.

The sense amplifier S/A includes cross-coupled dynamic latch circuits (hereinafter, "latch circuits") LC1 and LC2. The latch circuit LC1 is configured to include two P-type transistors TP1 and TP2 connected in series between the sense nodes SNL and SNR. A gate of the transistor TP1 is connected to the sense node SNR, and a gate of the transistor TP2 is connected to the sense node SNL. Namely, the gates of the transistors TP1 and TP2 are cross-coupled to the sense nodes SNL and SNR. The latch circuit LC2 is configured to include two N-type transistors TN1 and TN2 connected in series between the sense nodes SNL and SNR. A gate of the transistor TN1 is connected to the sense node SNR, and a gate of the transistor TN2 is connected to the sense node SNL. Namely, the gates of the transistors TN1 and TN2 are cross-coupled to the sense nodes SNL and SNR. The latch circuits LC1 and LC2 are driven by activating signals SAP and bSAN, respectively.

The sense amplifier S/A also includes a current mirror-type current load circuit (hereinafter, "mirror circuit") CMC configured to include P-type transistors TP3 to TP8. The mirror circuit CMC is configured to apply an equal current to the sense nodes SNL and SNR. The transistors TP3 and TP4 are controlled by a load signal BLOADON and function as switching element switching over between a power supply VBLH and the mirror circuit CMC. The power supply VBLH indicates a high potential applied to one bit line BL when data "1" is written to a memory cell MC.

The transistors TP7 and TP8 are controlled by signals CM and bCM, respectively, and connect gates of the transistors TP5 and TP6 to the sense nodes SNL and SNR, respectively. If the sense amplifier S/A is to detect data stored in the memory cells MC connected to the bit line BLL, one dummy cell DC is connected to the bit line BLR. At this time, a potential of the signal bCM is set to a low level potential and that of the signal CM is set to a high level potential. By setting so, a common gate to the transistors TP5 and TP6 is connected to the sense node SNR across which the reference current Iref is carried, so that it is possible to accurately detect the data stored in the memory cells MCs using the reference current Iref. Needless to say, if the sense amplifier S/A is to detect data stored in the memory cells MCs connected to the bit line BLR, then the potential of the signal bCM is set to a high level potential, and that of the signal CM is set to a low level potential.

An N-type transistor TN4 is connected between the DQ line and the sense node SNL, and an N-type transistor TN5 is connected between a bDQ line and the sense node SNR. Gates of the transistors TN4 and TN5 are connected to a column selection line CSLi (hereinafter, also "CSL"). The DQ line and the bDQ line are connected to the DQ buffer. The DQ buffer is connected to an I/O circuit. During the data read operation, the DQ buffer temporarily stores therein data from the memory cells MCs so as to output the data to the outside. During the data write operation, the DQ buffer temporarily stores therein data from the outside so as to transmit the data to the sense amplifier S/A. The column selection line CSL is, therefore, activated when data is read to the outside or written from the outside, and enables the sense nodes SNL and SNR to be connected to the DQ buffer. During the refresh operation, the column selection line CSL is kept inactive.

An N-type transistor TN6 is connected between the bit line BLLi and a low potential VBLL. A gate of the transistor TN6 is connected to a signal line DCWLL. An N-type transistor TN7 is connected between the bit line BLRi and the low potential VBLL. A gate of the transistor TN7 is connected to a signal line DCWLR. The low potential VBLL indicates a low potential applied to a bit line BL when data "0" is written to a memory cell MC connected to the bit line BL. For example, the low potential VBLL is −1.5 V. Each of the signal lines DCWLL and DCWLR is activated when data "0" is written to one dummy cell DC0. Namely, data "0" is written to the dummy cell DC0 connected to the bit line BLLi or BLRi.

Meanwhile, P-type transistor TP9 is connected between a bit line BLLi+1 and the high potential VBLH. A gate of the transistor TP9 is connected to a signal line BDCWHL. A P-type transistor TP10 is connected between a bit line BLRi+1 and the high potential VBLH. A gate of the transistor TP10 is connected to a signal line BDCWHR. Each of the signal lines BDCWHL and BDCWHR is activated when data "1" is written to one dummy cell DC1. Namely, the data "1" is written to the dummy cell DC1 connected to the bit line BLLi+1 or BLRi+1.

Averaging lines AVL and AVR are connected to gates of each averaging transistor TAVL and each averaging transistor TAVR (hereinafter, also "TAVs"), respectively. Each of the averaging transistors TAVs is connected between two adjacent bit lines BLs, and the averaging transistors TAVs are connected in series. The averaging transistor TAV shorts the dummy cells DC0 and shorts the dummy cells DC1 as many as the dummy cells DC0 during the data read operation, thereby averaging currents carried across the dummy cells DC0 and DC1 and generating the reference current Iref.

The configurations of the memory cell array MCA and the sense amplifiers S/As shown in FIGS. 2 and 4, respectively are typical specific examples. These configurations can be changed to various other configurations. For example, each sense amplifier S/A can have a twin cell architecture (2 cell/bit system). In this system, data opposite in logic is stored in a pair of two memory cells MCs, respectively, thereby storing one-bit data.

Figure 5:
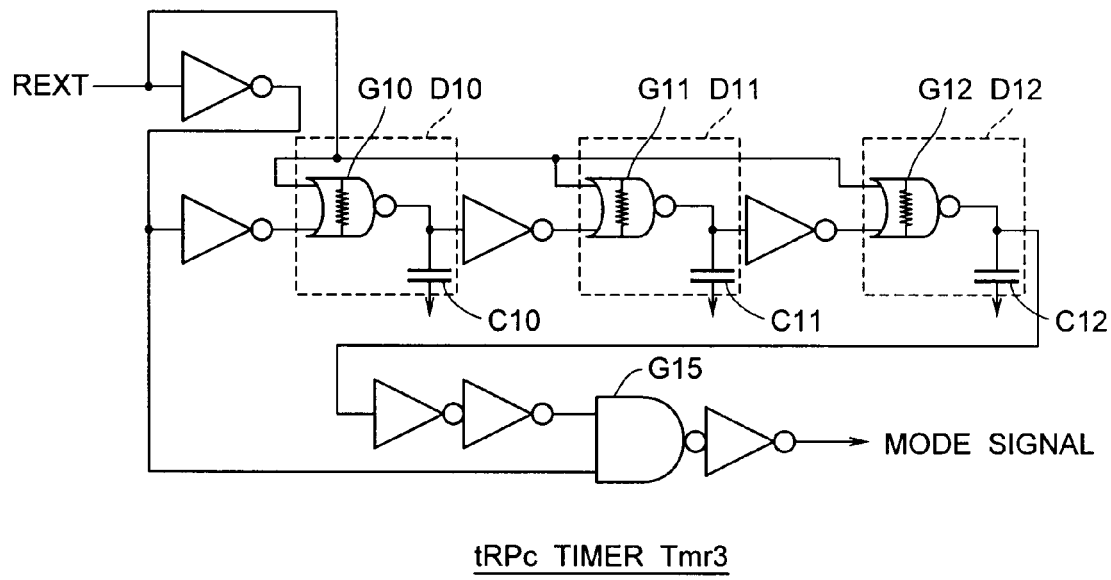
FIG. 5 is a circuit diagram showing an example of a configuration of the tRPc timer Tmr3.
Figure 6:
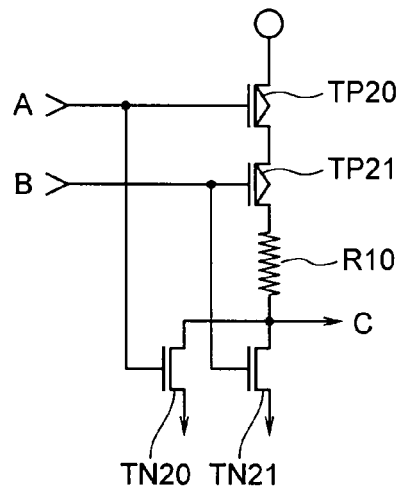
FIG. 6 is a circuit diagram showing an example of a configuration of each of the NOR gates G10 to G12.

FIG. 5 is a circuit diagram showing an example of a configuration of the tRPc timer Tmr3. The tRPc timer Tmr3 includes NOR gates G10 to G12, capacitors C10 to C12, and a NAND gate G15. FIG. 6 is a circuit diagram showing an example of a configuration of each of the NOR gates G10 to G12. Each of the NOR gates G10 to G12 includes two inputs A and B and one output C. Each of the NOR gates G10 to G12 is configured so that a resistor R10 is provided between a power supply and the output C on an ordinary NOR gate. More specifically, the resistor R10 is connected between transistors TP20, TN20 gates of which receive the input A and transistors TP21, TN21 gates of which receive the input B.

As shown in FIG. 5, the NAND gate G10 and the capacitor C10 constitute one RC delay circuit D10. Likewise, the NAND gate G11 and the capacitor C11 constitute one RC delay circuit D11, and the NAND gate G12 and the capacitor C12 constitute one RC delay circuit D12. The NAND gate G15 receives an inverted signal with respect to the signal REXT and an output signal from the delay circuit D12, and outputs the mode signal.

If the signal REXT is logically high (i.e., in the read or write mode), the tRPc timer Tmr3 sets the mode signal logically low. In this case, the gate G15 makes the output signal from the delay circuit D12 invalid and outputs the logically low signal as the mode signal. On the other hand, when delay time t10 caused by the delay circuits D10 to D12 passes since the signal REXT becomes logically low, the output signal from the delay circuit becomes logically high. At this time, since the gate G15 makes the output signal from the delay circuit D12 valid, the tRPc timer Tmr3 outputs the output signal from the delay circuit D12 as the mode signal. Namely, the tRPc timer Tmr3 determines that the FBC memory device is in the data retention mode not right after the signal REXT becomes logically low but when the delay time tRPc passes since the signal REXT becomes logically low. By doing so, the tRPc timer Tmr3 can set the refresh interval to the second interval only if it is ensured that no data read or write operation accesses the FBC memory device.

Note that "to make a signal valid" means that an element such as a gate circuit causes an input signal to pass therethrough. "To make a signal invalid" means that an element such as a gate circuit shuts off an input signal.

The delay time tRPc should be longer than a minimum value tRPmin of a RAS precharge period decided by specifications of the FBC memory device.

If the delay time tRPc is excessively long, the tRPc timer Tmr3 determines endlessly that the FBC memory device is in the data read or write mode and keeps setting the refresh interval to the first interval. Since the first interval is shorter than the second interval, the refresh operation is executed more frequently. This is against the object of the first embodiment to suppress power consumption. Accordingly, it is unpreferable that the delay time tRPc is too long. Depending on a purpose of the FBC memory device, the delay time tRPc is preferably several μs to several ms.

Although it is necessary to set the number of RC delay circuits to be connected to one another to an odd number, the number is not limited to a specific one. Accordingly, the number of connected RC delay circuits can be one or five or more.

Figure 7:
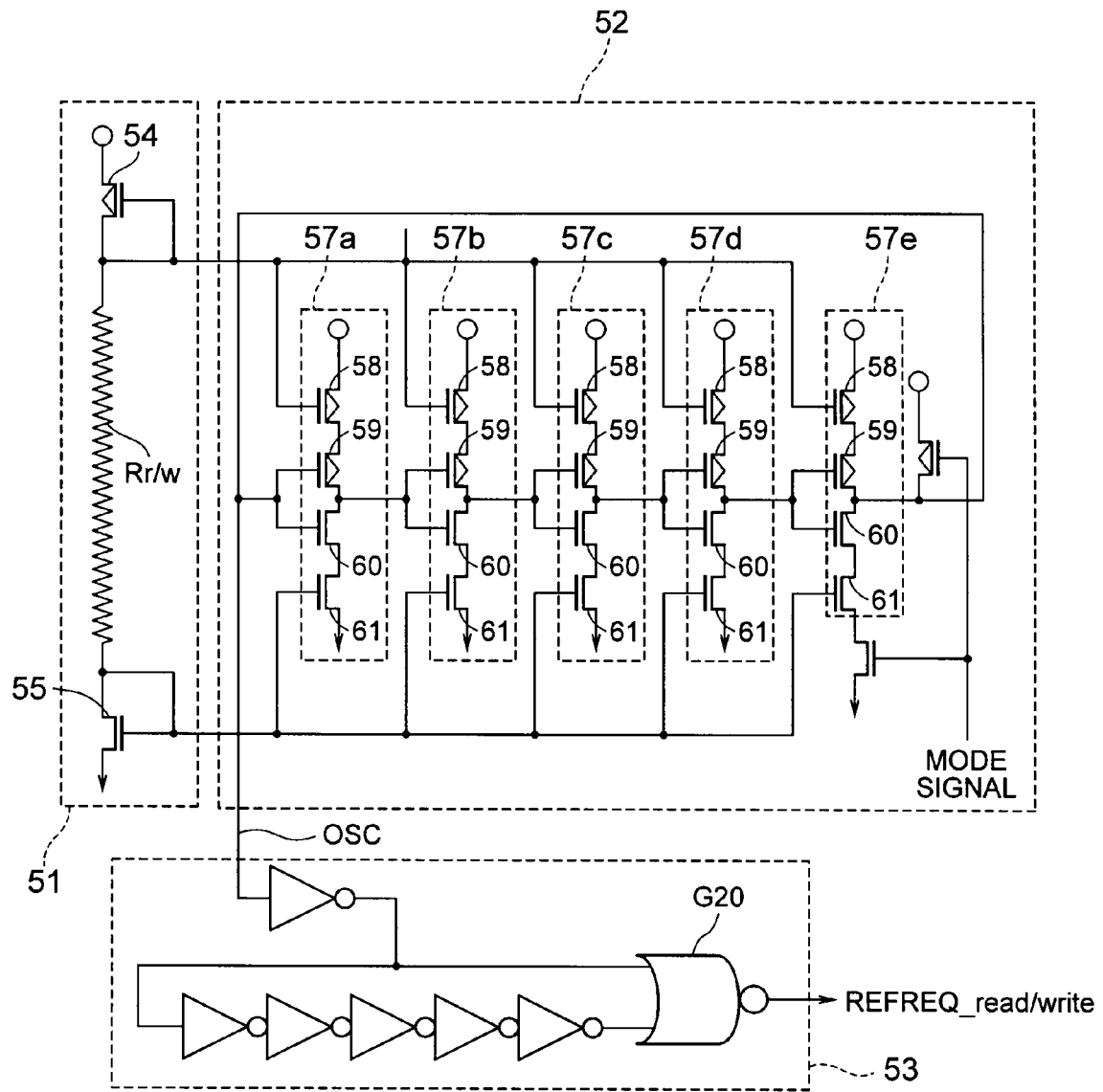
FIG. 7 is a circuit diagram showing an example of a configuration of the first refresh interval timer Tmr1.

FIG. 7 is a circuit diagram showing an example of a configuration of the first refresh interval timer Tmr1. The first refresh interval timer Tmr1 includes a bias circuit 51, a ring oscillator 52, and an output circuit 53. The bias circuit 51 includes a current-mirror-connection PMOS transistor 54 in which a gate and a drain are shorted to each other, a current-mirror-connection NMOS transistor 55 in which a gate and a drain are shorted to each other similarly to the PMOS transistor 54, and a resistor Rr/w connected between the drain of the PMOS transistor 54 and that of the NMOS transistor 55.

The ring oscillator 52 includes five stages of logic inverting circuits 57a to 57e connected in series, and an output from the logic inverting circuit 57e at the last stage is fed back to an input of the logic inverting circuit 57a at the first stage. Each of the logic inverting circuits 57a to 57e includes PMOS transistors 58 and 59 and NMOS transistors 60 and 61 connected in series between a power supply voltage and a ground voltage. The inverted signal with respect to the mode signal is input to the ring oscillator 52, and the ring oscillator 52 outputs a signal OSC to the output circuit 53 according to the input inverted signal.

The transistor 54 in the bias circuit 51 and the transistors 58 in the ring oscillator 52 constitute a current mirror circuit. The transistor 55 in the bias circuit 51 and the transistors 61 in the ring oscillator 52 constitute a current mirror circuit. Therefore, a current equal in amount to a current carried across the bias circuit 51 is carried across the transistors 58 and 61 in the ring oscillator 52.

The output circuit 53 includes a NOR circuit G20 that receives an inverted signal with respect to the output signal OSC from the ring oscillator 52 and a signal that is the delayed output signal OSC from the ring oscillator 52, and that performs a NOR between the received signals. The output circuit 53 sets the signal REFREQ_read/write logically high for a predetermined time when a state of the output signal OSC changes from logically low to logically high. Namely, the output circuit 53 decides a pulse length (time for which a pulse rises) of the signal REFREQ_read/write. When the state of the output signal OSC changes from logically high to logically low, the output circuit 53 keeps the signal REFREQ_read/write to be logically low.

The first refresh interval timer Tmr1 applies the current equal in amount to that carried across the bias circuit 51 to each of the logically inverting circuits 57a to 57e. Accordingly, if a resistance of the resistor Rr/w is high, an amount of the current carried across the transistor 54 or 55 is small. In this case, an amount of a current carried from a power supply (or ground) to an output node or that of a current carried from the output node to the ground in each of the logically inverting circuits 57a to 57e is small. Therefore, it takes a long time for each of the logically inverting circuits 57a to 57e to invert a signal. Namely, if the resistance of the resistor Rr/w is set high, delay time of the logically inverting circuits 57a to 57e is long. Further, the output of the logically inverting circuit 57e is fed back to the input of the logically inverting circuit 57a and the number of stages of the logically inverting circuits 57a to 57e is odd (five in the first embodiment). Due to this, the ring oscillator 52 regularly outputs pulses. To increase the delay time of the logically inverting circuits 57a to 57e means to increase the interval (refresh interval) from rising of a certain pulse to rising of a next pulse. Accordingly, the first refresh interval timer Tmr1 can decide the first interval based on the resistance of the resistor Rr/w.

Figure 8:
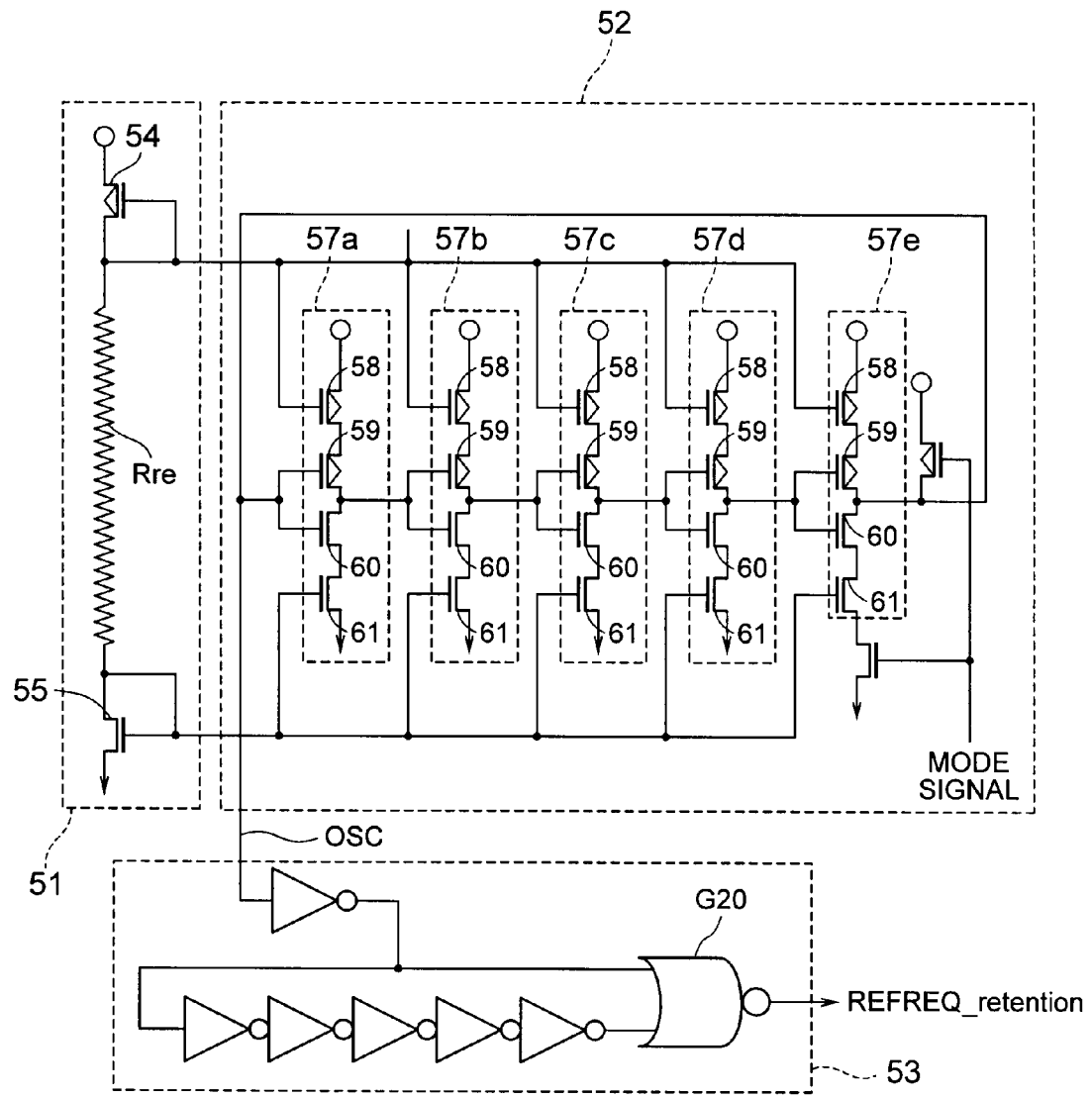
FIG. 8 is a circuit diagram showing an example of a configuration of the second refresh interval timer Tmr2.

FIG. 8 is a circuit diagram showing an example of a configuration of the second refresh interval timer Tmr2. A resistance of a resistor Rre in a bias circuit 51 of the second refresh interval timer Tmr2 differs from the resistance of the resistor Rr/w of the bias circuit 51 of the first refresh interval timer Tmr1. Further, a ring oscillator 52 of the second refresh interval timer Tmr2 receives the mode signal. The other configurations of the second refresh interval timer Tmr2 are similar to those of the first refresh interval timer Tmr1.

The resistance of the resistor Rre is set higher than that of the resistor Rr/w. Therefore, the refresh interval of the second refresh interval timer Tmr2 is longer than that of the first refresh interval timer Tmr1. Accordingly, the second refresh interval timer Tmr2 activates the signal REFREQ_retention at the second interval longer than the first interval.

Figure 9:
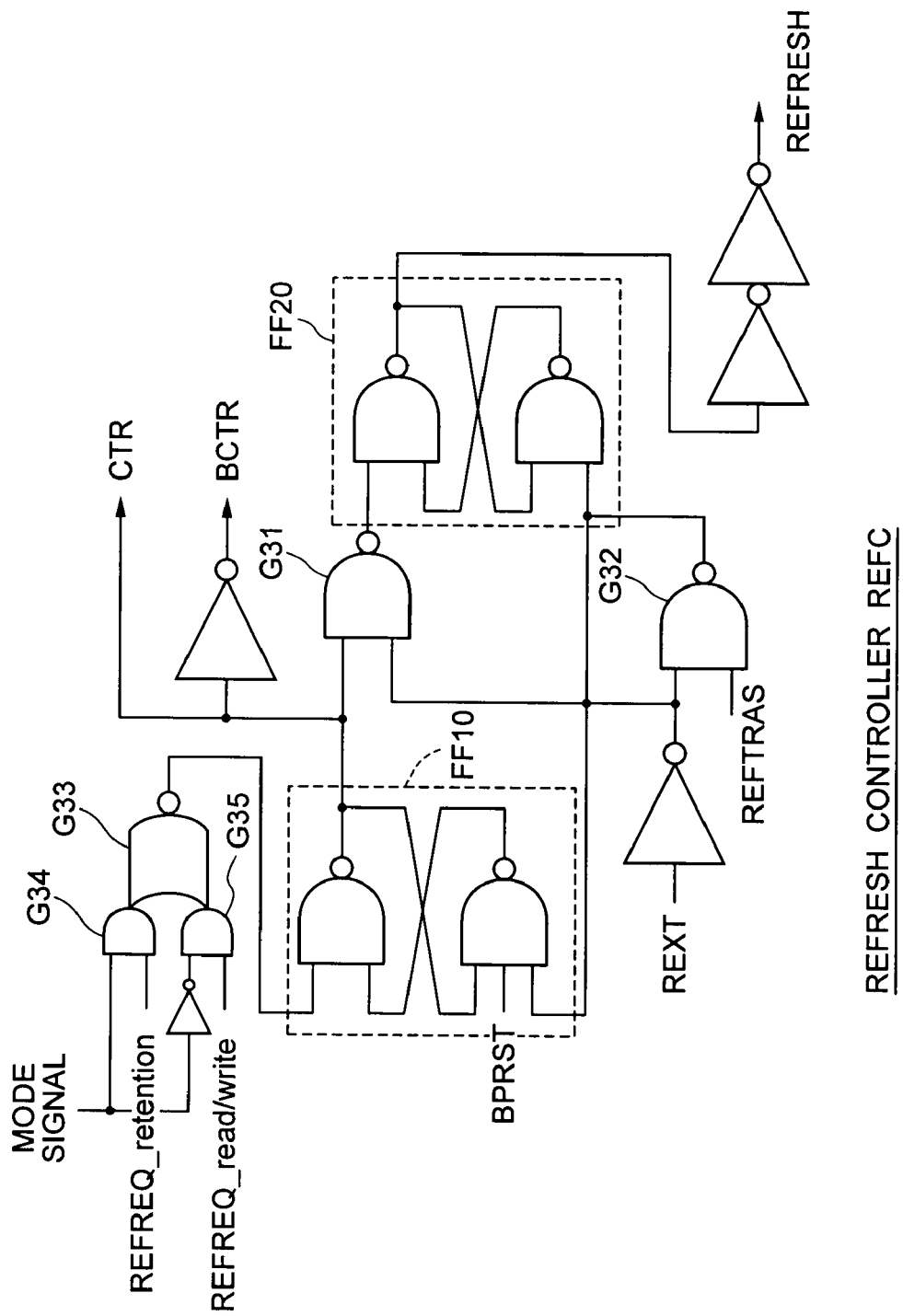
FIG. 9 is a circuit diagram showing an example of a configuration of the refresh controller REFC.

FIG. 9 is a circuit diagram showing an example of a configuration of the refresh controller REFC. The refresh controller REFC includes flip-flops FF10 and FF20, NAND gates G31 and G32, a NOR gate G33, and AND gates G34 and G35. The refresh controller REFC outputs the refresh signal REFRESH and instructs a refresh operation.

The gate G34 receives the signal REFREQ_retention and the mode signal, and outputs a result of an AND between these signals. The gate G35 receives the signal REFREQ_read/write and the inverted signal with respect to the mode signal, and outputs a result of an AND between these signals. The gate G33 receives outputs from the gates G34 and G35, and outputs a result of a NOR between these signals.

In the read or write mode, the mode signal is logically low, so that the gate G34 makes the signal REFREQ_retention invalid and the gate G35 makes the signal REFREQ_read/write valid. At this time, the gate G33 outputs an inverted pulse with respect to a pulse of the signal REFREQ_read/write. The refresh interval is thereby set to the first interval.

Note that the regular refresh interval described above is performed not during execution of the read or write operation but during the interval (precharge interval) after end of a certain read or write operation until start of a next read or write operation. If the precharge period is shorter than the period tRPc, the refresh interval is set to the first interval. If the precharge period is equal to or longer than the period tRPC, the tRPC timer Tmr3 determines that the FBC memory device is in the data retention state and the refresh interval is, therefore, set to the second interval.

In the data retention mode, the mode signal is logically high. Therefore, the gate G35 makes the signal REFREQ_read/write invalid and the gate G34 makes the signal RFREQ_retention valid. At this time, the gate G33 outputs an inverted pulse with respect to a pulse of the signal REFREQ_retention. The refresh interval is thereby set to the second interval.

The flip-flop FF10 latches falling of the output pulse from the gate G33 until an output of the gate G32 is inverted. The falling of the output pulse from the gate G33 corresponds to falling of the pulse of the signal REFREQ_read/write or REFREQ_retention and decides when to start a refresh operation.

The gate G32 receives the inverted signal with respect to the signal REXT and the delay signal REFTRAS that is the delayed signal REFRESH, and outputs a result of a NAND between these signals. The output signal from the gate G32 is used to decide the end of a pulse output from each of the flip-flops FF10 and FF20 (the end of the refresh operation).

For example, if the signal REXT is logically high (in the data retention mode or the precharge period of the read or write mode), the gate G31 shown in FIG. 9 inverts the output from the flip-flop FF10 and transmits the inverted output to the flip-flop FF20. In this state, if the signal REFREQ_retention or REFRESQ_read/write (hereinafter, also simply "REFREQ") is activated to be logically high, the output from the gate G31 falls to be logically low. The refresh signal REFRESH is thereby activated to be logically high and a refresh operation starts. After activation of the refresh signal REFRESH, the refresh timer tRAS timer Tmr4 shown in FIG. 1 sets the delayed signal REFTRAS to be logically high. The output from the gate G32 shown in FIG. 9 is thereby made logically low, so that the flip-flops FF10 and FF20 are reset. Namely, the outputs from the flip-flops FF10 and FF20 fall to be logically low. The refresh operation thereby ends. It is assumed that the refresh interval from the start to the end of the refresh operation is τ. The refresh interval τ is defined by the refresh tRAS timer Tmr4 shown in FIG. 1. Since the refresh tRAS timer Tmr4 can be constituted by an ordinary delay circuit, it is not shown.

Figure 10:
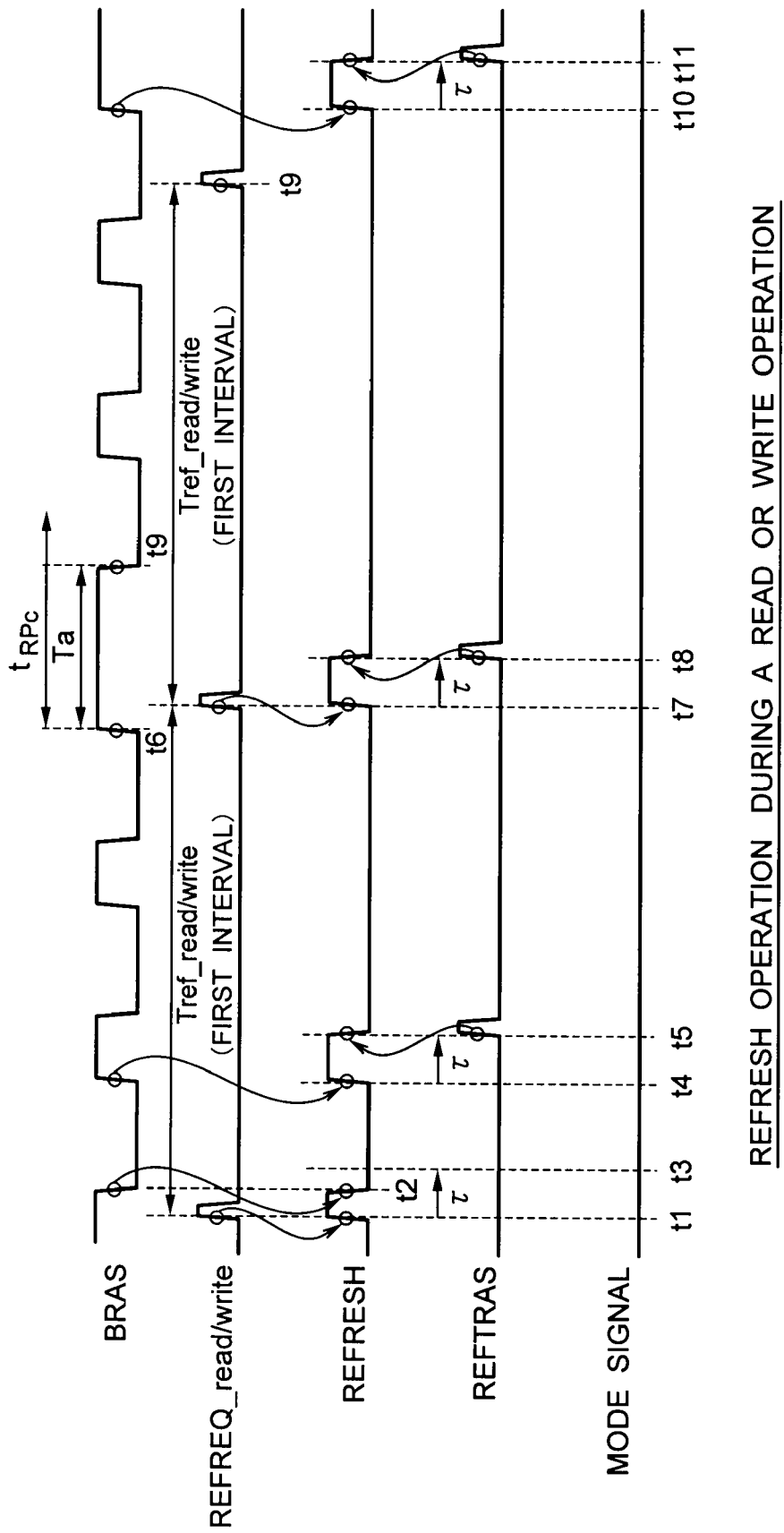
FIG. 10 is a timing chart showing the refresh operation in the read or write mode.

FIG. 10 is a timing chart showing the refresh operation in the read or write mode. At time t1, if the mode signal is logically low (indicates the read or write operation) and the signal BRAS is logically high (indicates the precharge period of the read or write operation), then the signal REFREQ_read/write is activated to be logically high and the refresh signal REFRESH is activated, accordingly. A refresh operation is thereby executed. Before the end of the refresh operation, at time t2, the signal BRAS is activated to be logically low and the FBC memory device enters the data read or write operation. In this case, the signal REXT shown in FIG. 9 is activated to be logically high, so that the signal REFRESH is deactivated to be logically low before rising of the signal REFTRAS deciding the end of the refresh operation. At this time, the flip-flop FF20 shown in FIG. 9 is reset but the flip-flop FF10 is not reset. Accordingly, counter signals CTR and BCTR are kept and the refresh address counter RAC shown in FIG. 1 keeps holding the address of the word line WL selected by the time t2.

At time t4, when the read or write operation ends (when the signal BRAS is deactivated to be logically high), the refresh signal REFRESH is activated to restart the refresh operation. At this time, the flip-flop FF10 shown in FIG. 9 is active without being reset (the output of the flip-flop FF10 is logically high). Accordingly, the signal REXT is deactivated, the gate G31 passes the output from the flip-flop FF10 through the flip-flop FF20, and the flip-flop FF20 turns active (the output of the flip-flop FF20 becomes logically high). As a result, the signal REFRESH is activated to be logically high.

Furthermore, the refresh address counter RAC holds the address of the selected word line WL at the interrupt time t2. Therefore, the refresh operation can restart at the word line WL selected at the interrupt time t2.

At time t5 passing from the time t4 by the refresh period τ, the signal REFTRAS is activated. The refresh operation thereby ends.

If the read or write operation does not interrupt the refresh operation, the refresh operation ends at the time t3 passing from the time t1 by the refresh period τ. However, in the example of FIG. 10, since the interrupt of the read or write operation is issued during the refresh operation, the signal REFTRAS does not rise at the time t3. The refresh operation restarts after the end of the read or write operation and then the refresh operation is completed.

By stopping the refresh operation once and executing the read or write operation preferentially over the refresh operation, a user can use the FBC memory device without being conscious of the refresh operation.

During a period Ta from t6 to t9, the signal BRAS is deactivated to be logically high. However, since the period Ta is shorter than the period tRPc, the tRPc timer shown in FIG. 5 does not raise the mode signal to be logically high. That is, in the period Ta from t6 to t9, the FBC memory device is kept in the read or write mode. From t7 to t8 in the period Ta, a refresh operation is executed. This refresh operation is completed without an interrupt of the read or write operation.

At time t9, when the signal BRAS is active to be logically low (indicates the read or write operation), the signal REFREQ_read/write is activated. In this case, the flip-flop FF10 shown in FIG. 9 is set active but the flip-flop FF20 is kept reset. This means that information that the signal REFREQ_read/write is activated and that a refresh request is issued is stored in the flip-flop FF10. Since the flip-flop FF20 is kept reset, no refresh operation starts yet.

At time t10, when the signal BRAS is deactivated to be logically high, the signal REXT shown in FIG. 9 is deactivated to be logically low. Accordingly, the gate G31 passes the output from the flip-flop FF10 through the flip-flop FF20 to turn the flip-flop FF20 active. The signal REFRESH is thereby activated to be logically high.

Thereafter, at time t11, the signal REFTRS rises and the refresh operation ends.

In this case, the refresh interval is a period Tref_read/write between the time t1 at which the signal REFREQ_read/write rises and the time t7 at which the signal REFREQ_read/write rises next time. This period Tref_read/write corresponds to the first interval, which is defined by the first refresh interval timer Tmr1 shown in FIG. 7.

Figure 11:
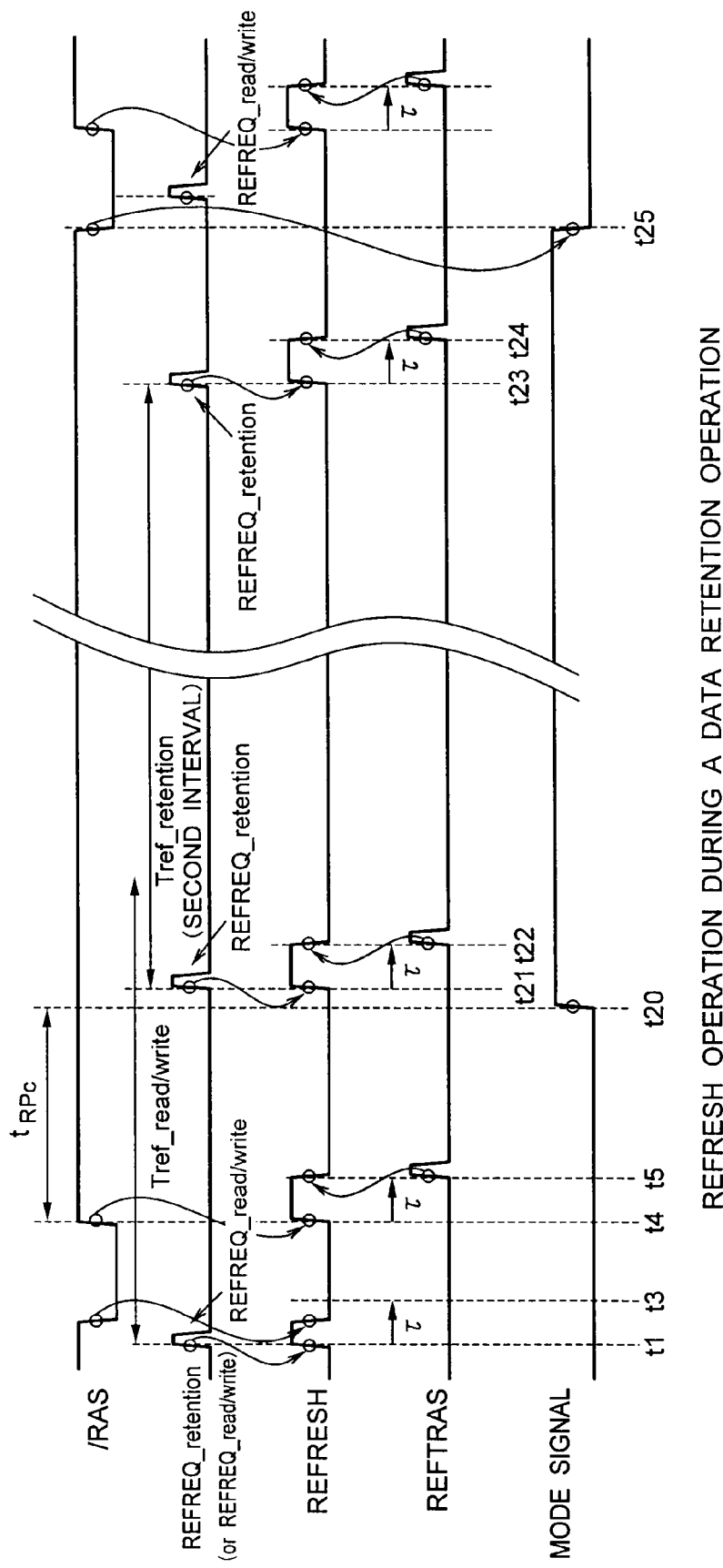
FIG. 11 is a timing chart showing the refresh operation in the data retention mode.

FIG. 11 is a timing chart showing the refresh operation in the data retention mode. The operation from time t1 to time t5 shown in FIG. 11 is similar to that from time t1 to time t5 shown in FIG. 10. Before time t20, the read or write operation is performed. When the period tRPc passes from the time t4 at which the signal BRAS is deactivated to be logically high, the tPRc timer Tmr3 shown in FIG. 4 raises the mode signal to be logically high. The FBC memory device thereby enters the data retention mode.

From time t21 to time t22 and from time t23 to time t24, a refresh operation is executed. Since the refresh operation is similar to that described with reference to FIG. 10, it will not be described herein.

In this case, the refresh interval is a period Tref_retention between the time t21 at which the signal REFREQ_retention rises and the time t23 at which the signal REFREQ_retention rises next time. This period Tref_retention corresponds to the second interval, which is defined by the second refresh interval timer Tmr2 shown in FIG. 8.

The second interval Tref_retention is longer than the first interval Tref_read/write. Therefore, in the first embodiment, it is possible to save current consumption of the refresh operation in the data retention mode.

At time t25, the signal BRAS is activated to be logically low. At this time, the tRPc timer Tmr3 promptly reduces the level of the mode signal. The FBC memory device can immediately move the mode from the data retention mode to the read/write mode. The user can use the FBC memory device without being conscious of the data retention mode.

In the data retention state, the memory cells MCs are disturbed in the regular refresh operation by as much as the number of word lines WLs. However, this disturbance is restricted and predictable. That is, because of lack of unpredictable access, the second interval can be set longer than the first interval during the read or write operation.

Second Embodiment

Figure 12:
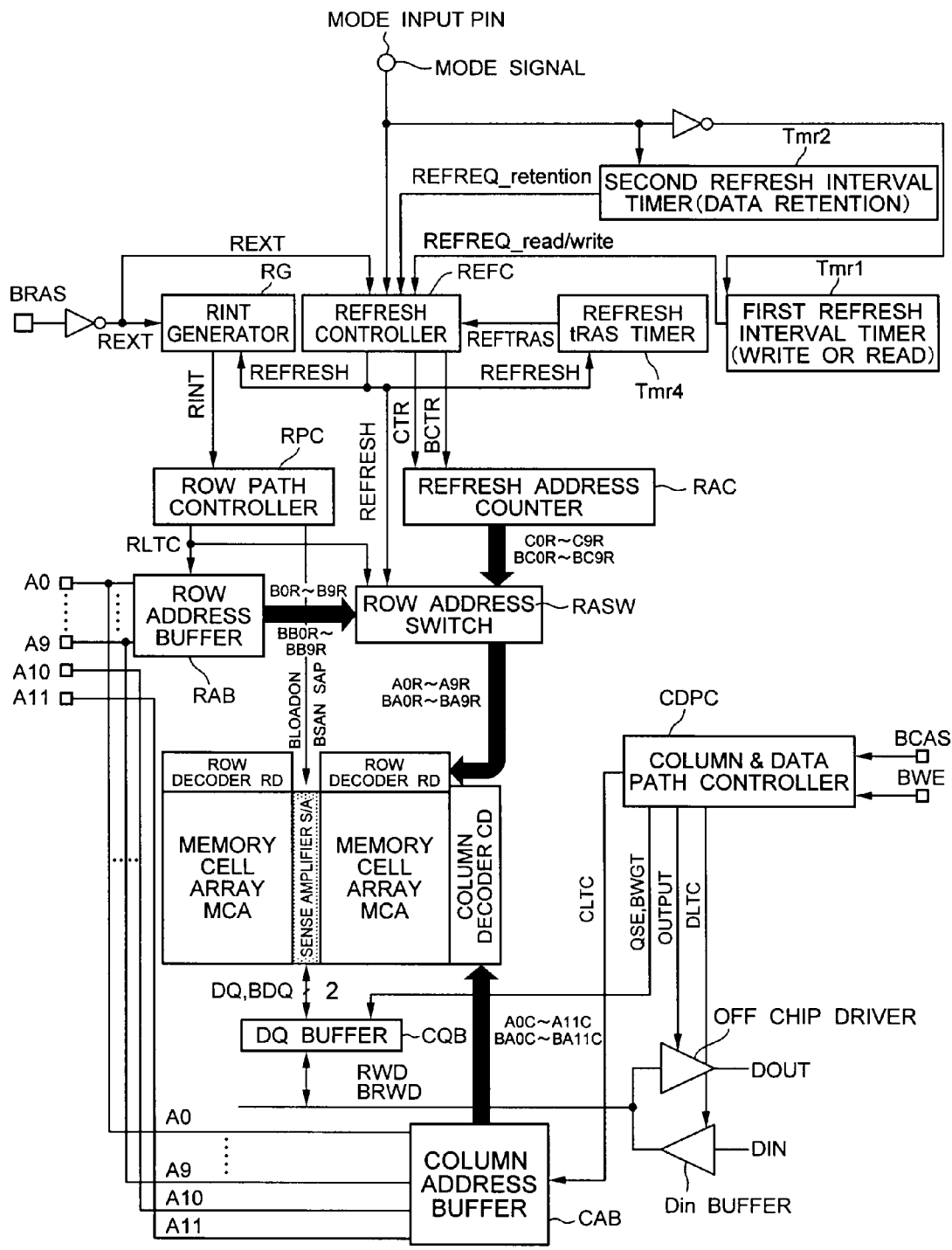
FIG. 12 is a block diagram showing a configuration of an FBC memory device according to a second embodiment of the present invention.

FIG. 12 is a block diagram showing a configuration of an FBC memory device according to a second embodiment of the present invention. The FBC memory device according to the second embodiment does not include the tRPc timer Tmr3 but includes a mode input pin to which the mode signal is input from the outside. Other configurations of the second embodiment can be similar to those of the first embodiment.

For example, if the FBC memory device receives a logically low signal as the mode signal from the outside, then it is determined that the FBC memory device is in the read or write mode, and the refresh interval is set to the first interval. If the FBC memory device receives a logically high signal as the mode signal from the outside, then it is determined that the FBC memory device is in the data retention mode, and the refresh interval is set to the second interval. The other operations in the second embodiment are similar to those in the first embodiment.

Even if the FBC memory device is configured to input the mode signal for identifying whether the mode is the read or write mode or the data retention mode from the outside as described in the second embodiment, the FBC memory device can attain the advantages of the present invention.

Third Embodiment

Figure 13:
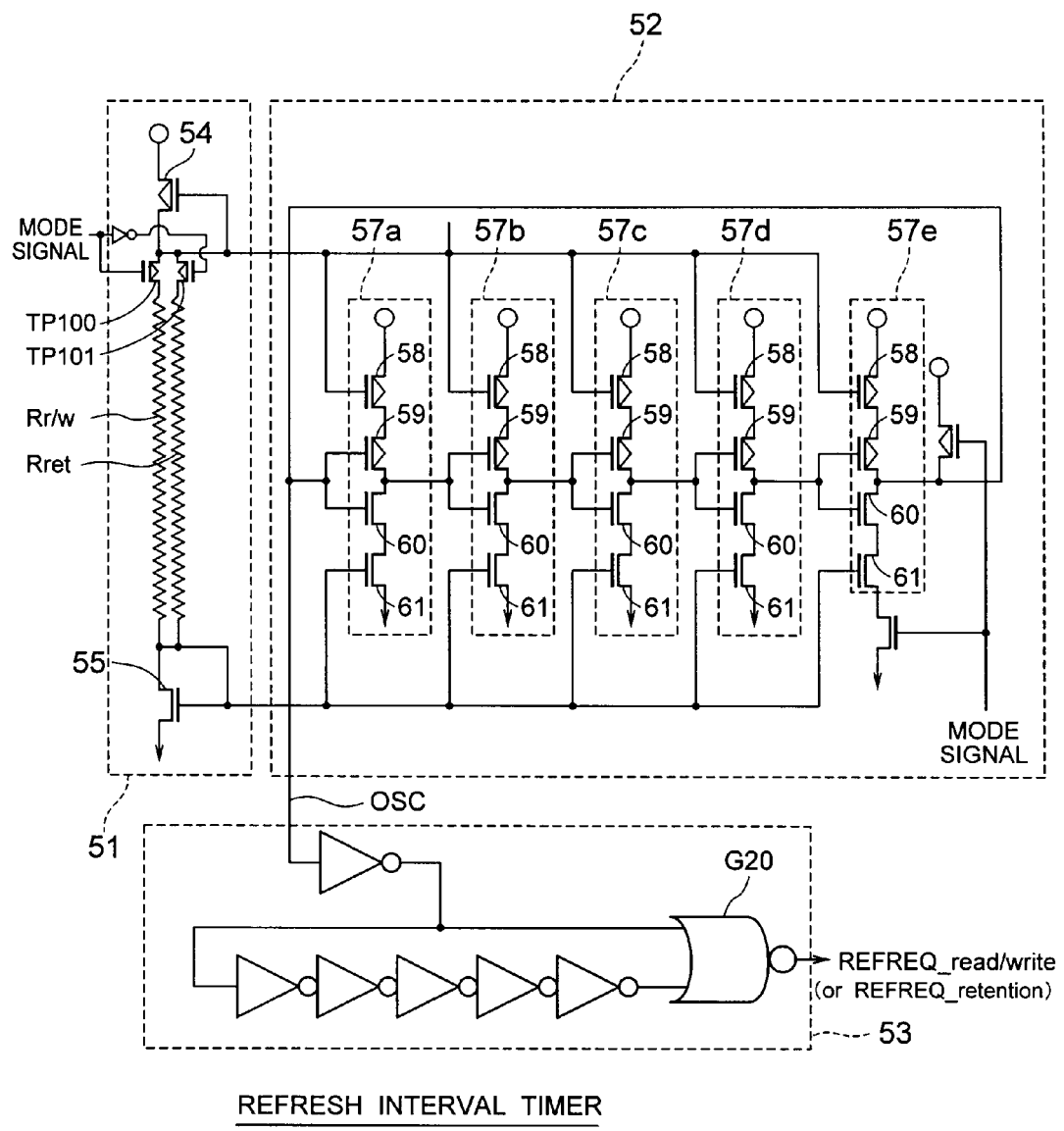
FIG. 13 is a circuit diagram showing an example of a refresh interval timer of an FBC memory device according to a third embodiment of the present invention.

FIG. 13 is a circuit diagram showing an example of a refresh interval timer of an FBC memory device according to a third embodiment of the present invention. The refresh interval timer according to the third embodiment includes a ring oscillator 52, an output circuit, and transistors 54 and 55, and acts as both the first refresh interval timer Tmr1 and the second refresh interval timer Tmr2 according to the first embodiment. The refresh interval timer individually includes resistors Rr/w and Rret. The resistors Rr/w and Rret commonly share the same ring oscillator 52, the same output circuit, and the same transistors 54 and 55. Accordingly, a P-type transistor TP100 is provided between the transistor 54 and the resistor Rr/w, and a P-type transistor TP101 is provided between the transistor 54 and the resistor Rret. The transistor TP100 receives the mode signal at its gate. The transistor TP101 receives the inverted signal with respect to the mode signal at its gate. Therefore, if the mode signal is logically low (indicates the read or write mode), the resistor Rr/w is connected between the transistors 54 and 55. As a result, the output circuit 53 outputs the signal REFREQ_read/write. On the other hand, if the mode signal is logically high (indicates the data retention mode), the resistor Rret is connected between the transistors 54 and 55. As a result, the output circuit 53 outputs the signal REFREQ_retention.

Other configurations of the third embodiment can be similar to those of the first and second embodiments. According to the third embodiment, there is no need to provide the ring oscillator 52, the output circuit 53, and the transistors 54 and 55 to correspond to each of the resistors Rr/w and Rret. Therefore, it is possible to accurately set the first interval and the second interval based on the resistances of the resistors Rr/w and Rret, respectively, without irregularities generated by the ring oscillator 52, the output circuit 53, and the transistors 54 and 55. Since the circuit configuration of the refresh interval timer can be simplified, the FBC memory device can be downsized. Further, the third embodiment can achieve effects of the first and second embodiments.

Fourth Embodiment

According to a fourth embodiment of the present invention, a refresh operation is performed only on "0" cells without refreshing "1" cells. This is because data deterioration of the FBC memory device in the data retention mode normally occurs only to the "0" cells.

The bit line "0" disturbance occurs when a weak forward bias is applied between the body and the drain of a "1" cell. If the potential of the word line WL connected to the "1" cell is set sufficiently low, it is possible to make the forward bias between the body and the drain quite low and lessen the influence of the bit line "0" disturbance.

Figure 14:
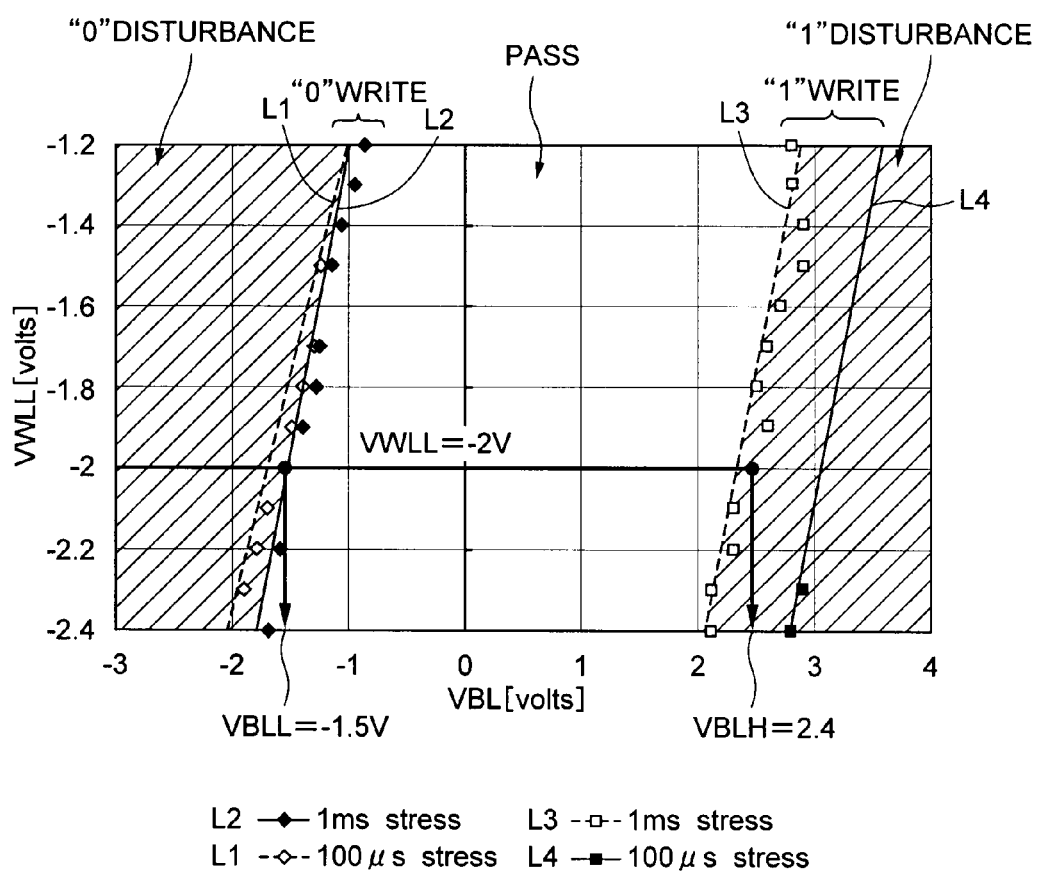
FIG. 14 is a graph showing the relationship between a voltage VWLL of one word line WL in the data retention mode and a voltage VBL of the word line WL in the data write operation.

FIG. 14 is a graph showing the relationship between a voltage VWLL of one word line WL in the data retention mode and a voltage VBL of the bit line BL in the data write operation. Lines L1 and L2 represent voltages for writing data "0" and lines L3 and L4 represent voltages for writing data "1". Further, the lines L1 and L4 represent characteristics when the potential VBLL or VBLH is applied to one bit line BL for a period of 100 μs, and the lines L2 and L3 represent characteristics when the potential VBLL or VBLH is applied to one bit line BL for a period of 1 ms. Note that the VBLL is the bit line voltage applied when data "0" is written to a memory cell MC connected to the bit line BL and that the VBLH is the bit line voltage applied when data "1" is written to the memory cell MC.

A region on the left of the lines L1 and L2 is a region in which the memory cell MC is judged as a failure due to the influence of the bit line "0" disturbance. A region on the right of the lines L3 and L4 is a region in which the memory cell MC is judged as a failure due to the influence of the bit line "1" disturbance. A region between the lines L1 and L4 and that between the lines L2 and L3 are regions in which the memory cell MC passes (is judged as a good product).

As can be seen from the graph of FIG. 14, if the voltage VWLL of the word line WL in the data retention mode is lower, the failure region caused by the bit line "0" disturbance is smaller. For example, if the voltage VWLL is −2 V, the memory cell MC judged as a failure due to the bit line "0" disturbance is judged as a good product by reducing the voltage VWLL to −2.4 V.

On the other hand, if the voltage VWLL is lower, the failure region caused by the bit line "1" disturbance is wider. Accordingly, if the voltage VWLL of the word line WL in the data retention mode is set sufficiently low, it is possible to sufficiently suppress the bit line "0" disturbance and avoid the bit line "1" disturbance by performing a refresh operation according to the fourth embodiment. Since the bit line "1" disturbance cannot occur in the data retention mode, no problem occurs even by sufficiently reducing the word line potential in the data retention mode.

Figure 15:
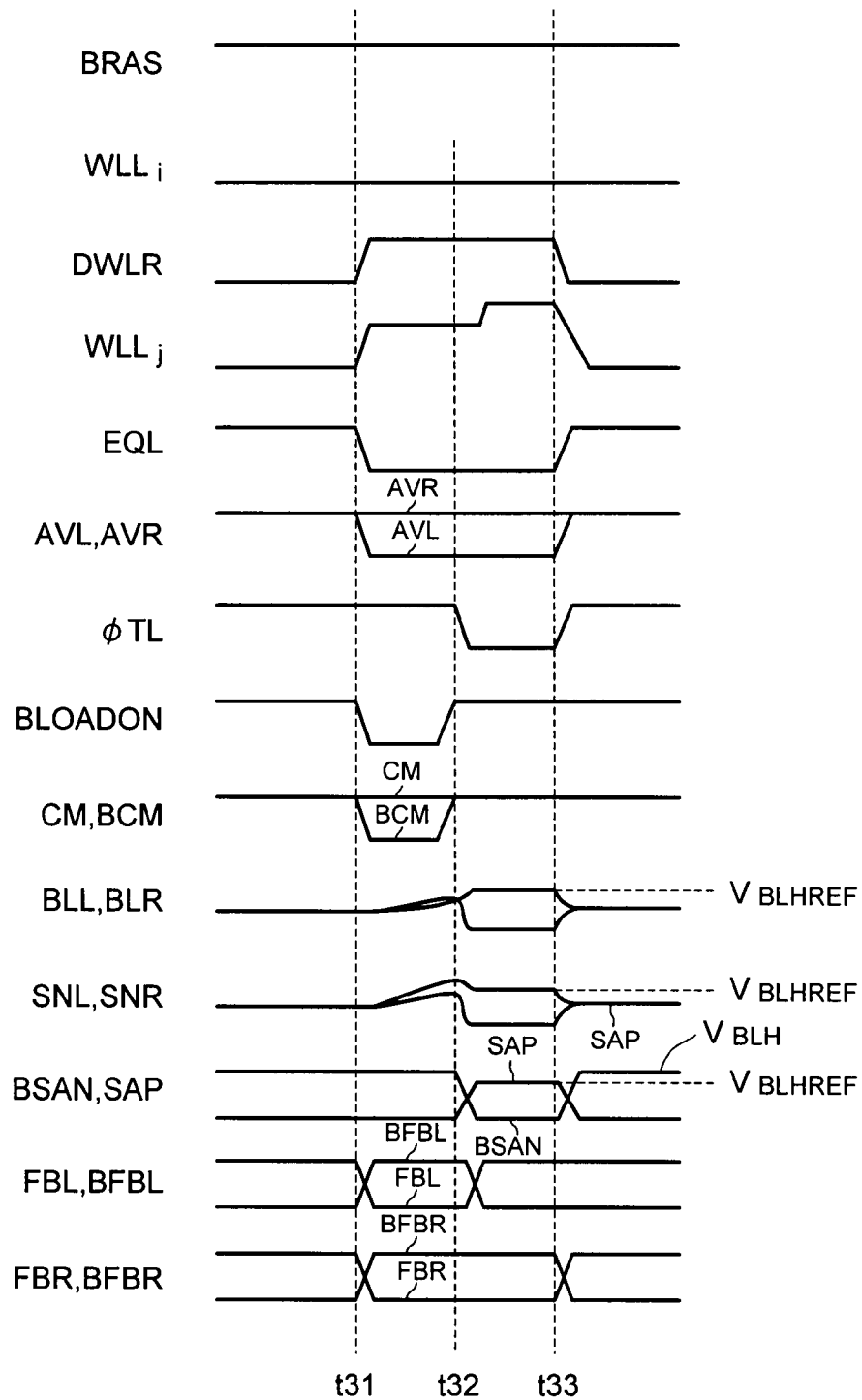
FIG. 15 is a timing chart showing a refresh operation for refreshing only "0" cells.

FIG. 15 is a timing chart showing a refresh operation for refreshing only "0" cells. At time t31, the refresh operation starts. From t31 to t32, an initial sense operation is performed. When the signal difference between the sense nodes SNL and SNR sufficiently increases, the latch circuits LC1 and LC2 shown in FIG. 4 latch the signal difference.

Note that a voltage of the signal SAP is set to VBLHREF lower than the high potential VBLH after time t32. The signal SAP is used to write data "1" to each memory cell MC. By setting the voltage of the signal SAP to VBLHREF, the voltage of the bit line BL connected to the "1" cell is set to VBLHREF lower than the voltage VBLH for writing the data "1". By so setting, the refresh operation is performed not on "1" cells but only on "0" cells. Furthermore, since the potential of the bit line BL connected to the "1" cell is low, the bit line "1" disturbance is suppressed and current consumption can be reduced. The voltage VBLHREF can be set equal to a precharge potential of each of the bit lines BLLs and BLRs or each of the sense nodes SNLs and SNR, that is, to the source potential VSL of each memory cell MC.

In a refresh operation during the read or write operation, the voltage of the signal SAP is set to VBLH so as to write data "1" to each memory cell MC.

In the fourth embodiment, the refresh operation is performed only on the "0" cells, so that the power consumption of the refresh operation can be further saved. The configuration of the fourth embodiment can be worked by adopting any one of the configurations of the FBC memory devices according to the first to third embodiments. Therefore, the fourth embodiment can be combined with any one of the first to third embodiments.

The invention claimed is:

1. A semiconductor memory device comprising:
   a plurality of memory cells including floating bodies in electrically floating state and storing therein logic data according to the number of carriers accumulated in the floating bodies;
   a plurality of bit lines connected to the memory cells;
   a plurality of word lines connected to the memory cells;
   a plurality of sense amplifiers connected to the bit lines, and one of the sense amplifiers reading data stored in one of the memory cells selected by one of the bit lines and one of the word lines or writing data to the one of the memory cells selected by the one of the bit lines and one of the word lines;
   a refresh controller instructing a refresh operation for restoring deteriorated storage states of the memory cells;
   a refresh interval timer setting a refresh interval between one refresh operation and a next refresh operation to a first interval in a data read mode or a data write mode, and setting the refresh interval to a second interval longer than the first interval in a data retention mode, the data read mode being a mode in which the data stored in the selected memory cell is read to an outside of the device, the data write mode being a mode in which data from the outside is written to the selected memory cell; and
   an operation detection timer outputting a mode signal for deciding the refresh interval to the refresh interval timer, wherein
   the operation detection timer sets a logic of the mode signal to a first logic for setting the refresh interval to the first interval when an operation signal indicating the data read mode or the data write mode is active, and sets the logic of the mode signal to a second logic opposite to the first logic for setting the refresh interval to the second interval when the operation signal is inactive for a predetermined period.

2. The semiconductor memory device according to claim 1, wherein the operation detection timer includes a delay circuit regarding the logic of the mode signal output from the operation detection timer which is activated when the operation signal is inactive for the predetermined period.

3. The semiconductor memory device according to claim 1, wherein the mode signal and an output from the refresh interval timer are input to the refresh controller, and
   the refresh controller is controlled by the refresh interval timer to set the refresh interval to the first interval by setting a logic of the output from the refresh interval timer to the first logic when the logic of the mode signal is the first logic, and to set the refresh interval to the second interval by setting the logic of the output from the refresh interval timer to the second logic when the logic of the mode signal is the second logic.

4. The semiconductor memory device according to claim 1, wherein the refresh operation is performed only on memory cells storing therein one of the binary logic data.

5. A semiconductor memory device comprising:
   a plurality of memory cells including floating bodies in electrically floating state and storing therein logic data according to the number of carriers accumulated in the floating bodies;
   a plurality of bit lines connected to the memory cells;
   a plurality of word lines connected to the memory cells;
   a plurality of sense amplifiers connected to the bit lines, and one of the sense amplifiers reading data stored in one of the memory cells selected by one of the bit lines and one of the word lines or writing data to the one of the memory cells selected by the one of the bit lines and the one of the word lines;
   a refresh controller instructing a refresh operation for restoring deteriorated storage states of the memory cells;
   a refresh interval timer setting a refresh interval between one refresh operation and a next refresh operation to a first interval in a data read mode or a data write mode, and setting the refresh interval to a second interval longer than the first interval in a data retention mode, the data read mode being a mode in which the data stored in the selected memory cell is read to an outside of the device, the data write mode being a mode in which data from the outside is written to the selected memory cell, the refresh interval timer including a first refresh interval timer setting the refresh interval to the first interval in the data read mode or the data write mode and a second refresh interval timer setting the refresh interval to the second interval in the data retention mode; and
   an operation detection timer outputting a mode signal for deciding the refresh interval to the first refresh interval timer and the second refresh interval timer, wherein
   the operation detection timer sets a logic of the mode signal to a first logic for setting the refresh interval to the first interval when an operation signal indicating the data read mode or the data write mode is active, and sets the logic of the mode signal to a second logic opposite to the first logic for setting the refresh interval to the second interval when the operation signal is inactive for a predetermined period.

6. The semiconductor memory device according to claim 5, wherein the operation detection timer includes a delay circuit regarding the logic of the mode signal output from the operation detection timer which is activated when the operation signal is inactive for the predetermined period.

7. The semiconductor memory device according to claim 5, wherein the mode signal and an output from the first and the second refresh interval timer are input to the refresh controller, and
   the refresh controller is controlled by the first refresh interval timer to set the refresh interval to the first interval by setting a logic of the output from the first refresh interval timer to the first logic when the logic of the mode signal is the first logic, and to set the refresh interval to the second interval by setting the logic of the output from the second refresh interval timer to the second logic when the logic of the mode signal is the second logic.

8. The semiconductor memory device according to claim 5, wherein the refresh operation is performed only on memory cells storing therein one of the binary logic data.

9. A semiconductor memory device comprising:
a plurality of memory cells including floating bodies in electrically floating state and storing therein logic data according to the number of carriers accumulated in the floating bodies;
a plurality of bit lines connected to the memory cells;
a plurality of word lines connected to the memory cells;
a plurality of sense amplifiers connected to the bit lines, and one of the sense amplifiers reading data stored in one of the memory cells selected by one of the bit lines and one of the word lines or writing data to the one of the memory cells selected by the one of the bit lines and the one of the word lines;
a refresh controller instructing a refresh operation for restoring deteriorated storage states of the memory cells; and
a refresh interval timer setting a refresh interval between one refresh operation and a next refresh operation to a first interval in a data read mode or a data write mode, and setting the refresh interval to a second interval longer than the first interval in a data retention mode, the data read mode being a mode in which the data stored in the selected memory cell is read to an outside of the device, the data write mode being a mode in which data from the outside is written to the selected memory cell, wherein
a mode input pin, a mode signal for deciding the refresh interval being input to the mode input pin from the outside of the device.

10. A method of driving a semiconductor memory device, the semiconductor memory device including:
a plurality of memory cells including floating bodies in electrically floating state and storing therein logic data according to the number of carriers accumulated in the floating bodies;
a plurality of bit lines connected to a plurality of the memory cells;
a plurality of word lines connected to a plurality of the memory cells;
a plurality of sense amplifiers connected to the bit lines, and one of the sense amplifiers reading data stored in one of the memory cells selected by one of the bit lines and one of the word lines or writing data to one of the memory cells selected by one of the bit lines and one of the word lines; and
a refresh controller instructing a refresh operation for restoring deteriorated storage states of the memory cells, wherein the method comprises:
executing the refresh operation in a data read mode of reading the data stored in the selected memory cell to an outside or a data write mode of writing data from the outside to the selected memory cell while setting a refresh interval between one refresh operation and a next refresh operation to a first interval; and
executing the refresh operation in a data retention mode while setting the refresh interval to a second interval longer than the first interval, wherein
the semiconductor memory device further includes:
a refresh interval timer setting the refresh interval to the first interval in the data read mode or the data write mode and setting the refresh interval to the second interval in the data retention mode; and
an operation detection timer outputting a mode signal for deciding the refresh interval to the refresh interval timer, wherein the operation detection timer sets a logic of the mode signal to a first logic for setting the refresh interval to the first interval in the data read mode or the data write mode, and
the operation detection timer sets the logic of the mode signal to a second logic opposite to the first logic for setting the refresh interval to the second interval in the data retention mode.

11. The method of driving a semiconductor memory device according to claim 10, wherein the refresh operation is performed only on memory cells storing therein one of the binary logic data out of the plurality of memory cells.

* * * * *